US012796145B2

(12) United States Patent
Maruyama

(10) Patent No.: US 12,796,145 B2
(45) Date of Patent: Nov. 10, 2026

(54) IMAGING ELEMENT WITH PAD FOR TEST PROBE

(71) Applicant: SONY SEMICONDUCTOR SOLUTIONS CORPORATION, Kanagawa (JP)

(72) Inventor: Kota Maruyama, Kumamoto (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 1077 days.

(21) Appl. No.: 17/914,038

(22) PCT Filed: Feb. 10, 2021

(86) PCT No.: PCT/JP2021/004966

§ 371 (c)(1),
(2) Date: Sep. 23, 2022

(87) PCT Pub. No.: WO2021/199695

PCT Pub. Date: Oct. 7, 2021

(65) Prior Publication Data

US 2023/0117629 A1 Apr. 20, 2023

(30) Foreign Application Priority Data

Mar. 31, 2020 (JP) ................................ 2020-063974

(51) Int. Cl.
*H10F 39/00* (2025.01)
*H10F 39/95* (2026.01)
(Continued)

(52) U.S. Cl.
CPC ......... *H10F 39/809* (2025.01); *H10F 39/018* (2025.01); *H10F 39/028* (2025.01);
(Continued)

(58) Field of Classification Search
CPC ....... H10F 39/809; H10F 39/95; H10F 39/199
See application file for complete search history.

(56) References Cited

U.S. PATENT DOCUMENTS

| | | | | |
|---|---|---|---|---|
| 9,190,275 | B2 * | 11/2015 | Fujii | H04N 23/55 |
| 2008/0128848 | A1 | 6/2008 | Suzuki et al. | |

(Continued)

FOREIGN PATENT DOCUMENTS

| | | |
|---|---|---|
| JP | 2008-140819 | 6/2008 |
| JP | 2012-244100 | 12/2012 |

(Continued)

OTHER PUBLICATIONS

International Search Report and Written Opinion prepared by the Japan Patent Office on Apr. 6, 2021, for International Application No. PCT/JP2021/004966, 3 pgs.

*Primary Examiner* — Daniel Luke
(74) *Attorney, Agent, or Firm* — Sheridan Ross P.C.

(57) ABSTRACT

An imaging element including a plurality of semiconductor chips which are bonded together is prevented from being damaged. The imaging element includes the plurality of semiconductor chips each including a semiconductor substrate and a wiring region. One of the plurality of semiconductor chips is disposed with a photoelectric conversion unit that performs photoelectric conversion of incident light. Two of the plurality of semiconductor chips each includes a first pad, surfaces of the wiring regions of the two semiconductor chips being bonded together, the first pads being disposed on the respective surfaces of the wiring regions and being joined to each other. At least one of the two semiconductor chips further includes a second pad disposed in the wiring region and an insulating film disposed between the second pad and the surface for bonding, the second pad being formed with a protrusion toward the surface for bonding.

20 Claims, 19 Drawing Sheets

K

L

(51) Int. Cl.
*H10W 80/00* (2026.01)
*H10W 90/00* (2026.01)

(52) U.S. Cl.
CPC ........... *H10F 39/95* (2025.01); *H10W 80/312* (2026.01); *H10W 80/327* (2026.01); *H10W 90/792* (2026.01)

(56) References Cited

U.S. PATENT DOCUMENTS

| | | | |
|---|---|---|---|
| 2012/0298993 | A1 | 11/2012 | Nagata |
| 2014/0110811 | A1 | 4/2014 | Tsukimura |
| 2016/0233264 | A1 | 8/2016 | Kagawa et al. |
| 2017/0033144 | A1 | 2/2017 | Takahashi et al. |
| 2020/0195916 | A1* | 6/2020 | Ishii ...................... H10F 39/809 |

FOREIGN PATENT DOCUMENTS

| | | |
|---|---|---|
| JP | 2014-086596 | 5/2014 |
| WO | WO 2015/050000 | 4/2015 |
| WO | WO 2015/159766 | 10/2015 |
| WO | WO 2019/087764 | 5/2019 |

* cited by examiner

A

B

C

A

B

C

E

F

G

J

K

I

J

K

L

IMAGING ELEMENT WITH PAD FOR TEST PROBE

CROSS REFERENCE TO RELATED APPLICATIONS

This application is a national stage application under 35 U.S.C. 371 and claims the benefit of PCT Application No. PCT/JP2021/004966, having an international filing date of 10 Feb. 2021, which designated the United States, which PCT application claimed the benefit of Japanese Patent Application No. 2020-063974, filed 31 Mar. 2020, the entire disclosures of each of which are incorporated herein by reference.

TECHNICAL FIELD

The present disclosure relates to an imaging element and a method for manufacturing the imaging element. More particularly, the present disclosure relates to an imaging element configured by bonding a plurality of semiconductor chips together, and a method for manufacturing the imaging element.

BACKGROUND ART

In recent years, a semiconductor element in which a plurality of semiconductor chips are bonded together to be miniaturized has been used. As a method for manufacturing such a semiconductor element, a method for manufacturing the semiconductor by bonding wafers together is used. This is called WoW (Wafer on Wafer), which is a manufacturing method in which semiconductor wafers, on which integrated circuits before being separated into their individual pieces are formed, are bonded together, the bonded semiconductor chips are electrically connected to each other, and then the resulting wafer is diced into the individual integrated circuits. It is a manufacturing method with excellent productivity because of the bonding together in the form of wafer. However, there is a problem that this WoW has a reduced yield. Defective chips, such as those that do not operate normally, occur at a certain ratio in the semiconductor chips formed on a wafer before being separated into their individual pieces. As a result of bonding wafers containing such defective chips together, when a semiconductor chip on at least one of the wafers is defective, all the semiconductor elements separated into their individual pieces are determined as defective products. Therefore, the yield of the semiconductor element that has been subjected to the bonding step is lower than the yield of a single wafer.

In contrast to such WoW, a manufacturing method in which separated semiconductor chips are bonded to a wafer is also used. This method for manufacturing a semiconductor element is called CoW (Chip on Wafer). The yield can be prevented from being reduced by testing the semiconductor chips and their respective semiconductor chip regions of the wafer before bonding to select non-defective chips. As such a semiconductor element, for example, an imaging element is used which is configured by bonding a semiconductor chip in which pixels for generating an image signal in response to incident light are disposed and a semiconductor chip in which a processing circuit for processing the image signal is disposed. The imaging element can be miniaturized by bonding the plurality of semiconductor chips together. An image element has been proposed in which semiconductor chips are selected by performing an electrical test on the semiconductor chips before bonding, and the semiconductor chips confirmed to be good products are used for bonding (see PTL 1, for example).

CITATION LIST

Patent Literature

PTL 1

WO 2019/087764

SUMMARY

Technical Problem

The above-described conventional technique has a problem that the imaging element is damaged when the semiconductor chips are bonded after the test. The test of each semiconductor chip includes detecting electric signals through test pads formed on the surface of the semiconductor chip. The detection of electrical signals can be detected by means of test probes. Each test probe is provided with a metal needle, the tip of which is brought into contact with any test pad so that the test probe is electrically connected to the test pad. At this time, the needle of the test probe comes into contact with the test pad with a relatively high needle pressure. This penetrates the oxide film on the front surface of the test pad, which makes it possible to reduce the electrical resistance with the test pad. This contact of the needle of the test probe makes the front surface of the test pad uneven. When the semiconductor chips are bonded together, the tip of such uneven portions may damage the opposite semiconductor chip, resulting in a damaged imaging element.

The present disclosure is contrived in view of the above-described problems, and an object thereof is to prevent an imaging element including a plurality of semiconductor chips which are bonded together from being damaged.

Solution to Problem

The present disclosure has been made in order to solve the above-described problems, and a first aspect thereof is an imaging element including: a plurality of semiconductor chips each including a semiconductor substrate and a wiring region, the semiconductor chips being bonded together, one of the plurality of semiconductor chips being disposed with a photoelectric conversion unit that performs photoelectric conversion of incident light, two of the plurality of semiconductor chips each including a first pad, surfaces of the wiring regions of the two semiconductor chips being bonded together, the first pads being disposed on the respective surfaces of the wiring regions and being joined to each other when the surfaces are bonded, at least one of the two semiconductor chips further including a second pad disposed in the wiring region and an insulating film disposed between the second pad and the surface for bonding, the second pad being formed with a protrusion toward the surface for bonding.

Further, in the first aspect, the insulating film may be formed to have a thickness to cover the second pad.

Further, in the first aspect, the insulating film may be formed to have a thickness of 650 nm or more.

Further, in the first aspect, the insulating film may be formed of an insulating material.

Further, in this first aspect, the insulating film may contain the insulating material made of a silicon compound.

Further, in this first aspect, the imaging element may further include a protective metal film disposed on a surface of the second pad.

Further, in this first aspect, at least one of the plurality of semiconductor chips may further include a third pad for connecting to an external circuit.

Further, in this first aspect, the third pad may be disposed in a same layer as the second pad.

Further, in this first aspect, the second pad may be formed to have a different size from the first pad.

Further, in this first aspect, the second pad may be formed to have a size larger than the first pad.

Further, in this first aspect, the second pad may be made of aluminum.

Further, in this first aspect, the second pad may have the protrusion formed by a needle contact test.

Further, in this first aspect, the second pad may have the protrusion formed in a recess disposed on a side of the surface for bonding.

Further, in this first aspect, two of the plurality of semiconductor chips may each include the second pad disposed so as to face the other second pad.

Further, in this first aspect, the first pad may be made of copper.

Further, in this first aspect, at least one of the plurality of semiconductor chips may be disposed with a processing circuit for processing an image signal generated based on the photoelectric conversion.

Further, in this first aspect, two of the plurality of semiconductor chips may each be disposed with the processing circuit and may be bonded together.

Further, in this first aspect, the photoelectric conversion unit may perform photoelectric conversion of the incident light with which a different surface from the surface on which the wiring region of the semiconductor chip is disposed is irradiated.

Further, a second aspect of the present disclosure is a method for manufacturing an imaging element, the method including: a step of disposing a photoelectric conversion unit, in which the photoelectric conversion unit that performs photoelectric conversion of incident light is disposed on a semiconductor substrate; a step of disposing a second pad, in which the second pad is disposed in a wiring region, the second pad being formed with a protrusion toward a surface for bonding when wiring regions respectively disposed on two semiconductor substrates are bonded together; a step of forming an insulating film, in which the insulating film is formed on a surface of the second pad; a step of disposing a first pad, in which the first pad is disposed on a surface of the writing region in which the second pad is disposed, the first pad being joined to another first pad when the wiring regions are bonded together; and a step of bonding, in which the wiring regions of two semiconductor chips in which the first pads are disposed are bonded together and the respective first pads are joined to each other.

Further, in this second aspect, the method further includes a step of testing, in which a test is performed with the second pad disposed, and the step of forming an insulating film may include forming the insulating film in the wiring region in which the second pad with which the test has been performed is disposed.

This aspect of the present disclosure results in the insulating film being disposed on the front surface of the pad for the test. It is expected that the pad for the test is protected after the test.

DESCRIPTION OF EMBODIMENTS

Figure 1:
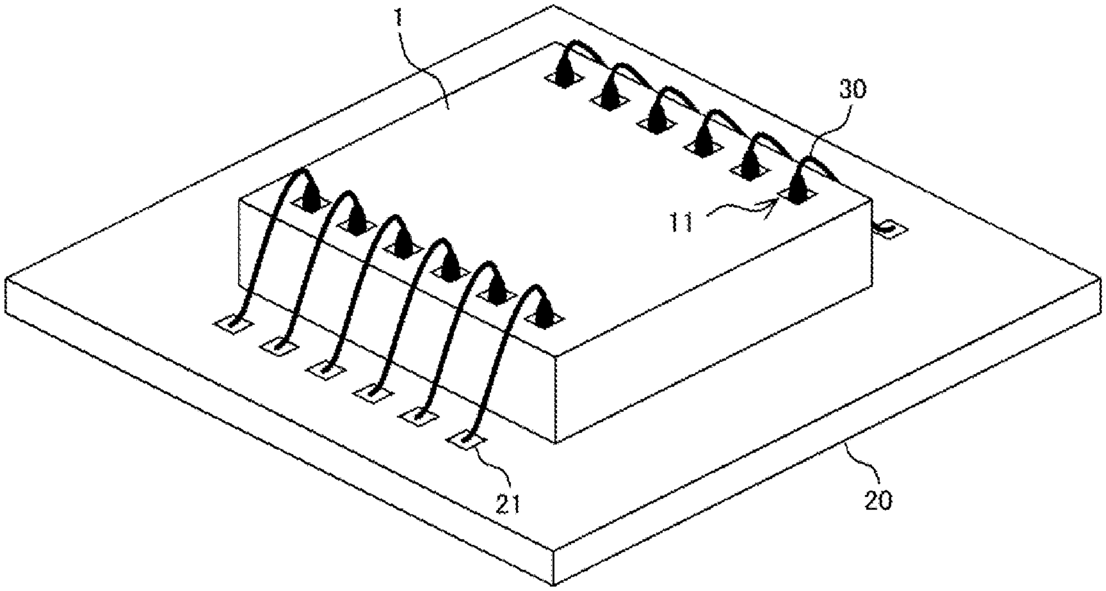
FIG. 1 is a diagram illustrating a configuration example of an imaging element according to an embodiment of the present disclosure.

Next, embodiments for implementing the present disclosure (hereinafter, referred to as embodiments) will be described with reference to the drawings. In the following drawings, the same or similar portions are denoted by the same or similar reference numerals and signs. In addition, the embodiments will be described in the following order.

1. First Embodiment
2. Second Embodiment
3. Third Embodiment
4. Fourth Embodiment
5. Example of Application to Camera

1. First Embodiment

[Appearance of Imaging Element]

FIG. 1 is a diagram illustrating a configuration example of an imaging element according to an embodiment of the present disclosure. That figure is a view illustrating the appearance of the imaging element 1. The imaging element 1 illustrated in that figure is configured of a semiconductor chip and is mounted as a bare chip on a substrate 20. The substrate 20 corresponds to a substrate or the like constituting a semiconductor package, and pads 21 for transmitting signals of the imaging element 1 are disposed thereon. The imaging element 1 is bonded to the substrate 20 and is connected to the pads 21 by wire bonding. Specifically, pads disposed on the imaging element 1 and the pads 21 of the substrate 20 are electrically connected to each other by means of bonding wires 30. The wire bonding pads of the imaging element 1 are disposed in an inner layer of the semiconductor chip constituting the imaging element 1, and the bonding wires are connected via openings 11 formed on the upper surface of the imaging element 1. In addition, a pixel array unit 50, which will be described later, is disposed on the upper surface of the imaging element 1.

[Configuration of Imaging Element]

Figure 2:
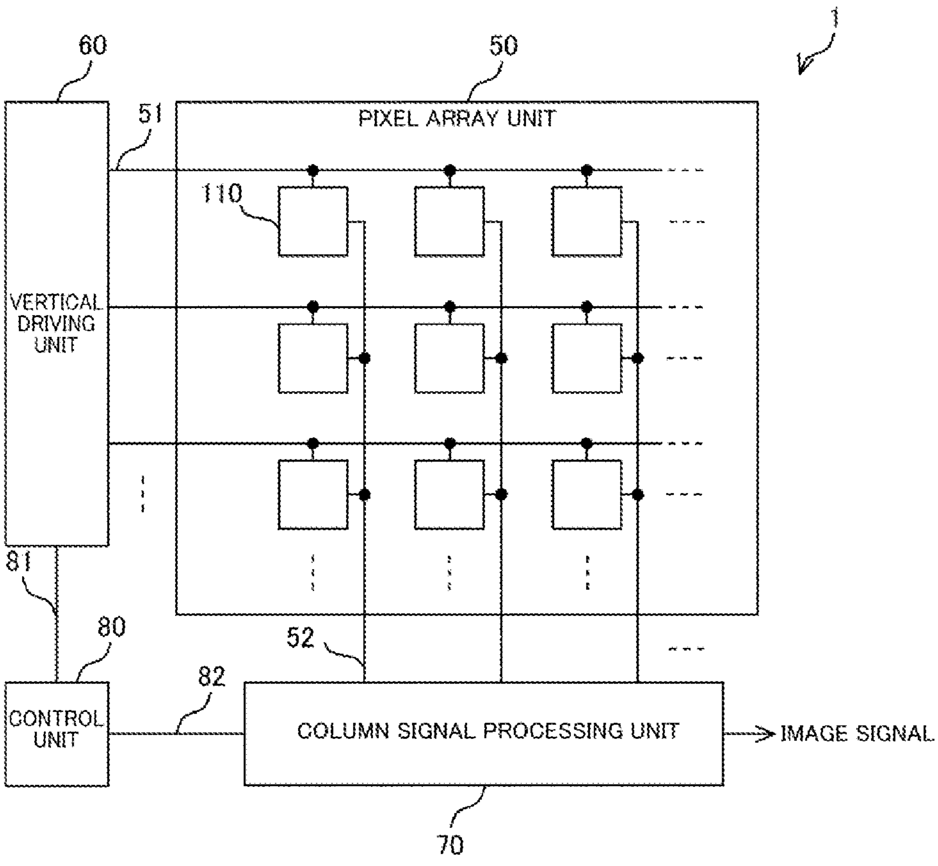
FIG. 2 is a block diagram illustrating a configuration example of an imaging element according to an embodiment of the present disclosure.

FIG. 2 is a block diagram illustrating a configuration example of the imaging element according to the embodiment of the present disclosure. The imaging element 1 includes the pixel array unit 50, a vertical driving unit 60, a column signal processing unit 70, and a control unit 80.

The pixel array unit 50 is configured with pixels 110 disposed in a two-dimensional lattice form. Here, the pixels 110 generate an image signal corresponding to emitted light. Each of the pixels 110 includes a photoelectric conversion unit that generates charge corresponding to emitted light. In addition, each of the pixels 110 further includes a pixel circuit. The pixel circuit generates an image signal based on charge generated by the photoelectric conversion unit. The generation of the image signal is controlled by a control signal generated by the vertical driving unit 60, which will be described later. Signal lines 51 and 52 are disposed in an XY matrix form in the pixel array unit 50. The signal line 51, which is a signal line for transmitting a control signal of the pixel circuit in the pixel 110, is disposed for each row of the pixel array unit 50 and is wired in common for the pixels 110 disposed in each row. The signal line 52, which is a signal line for transmitting an image signal generated by the pixel circuit of the pixel 110, is disposed for each column of the pixel array unit 50 and is wired in common for the pixels 110 disposed in each column. The photoelectric conversion unit and the pixel circuit are formed on a semiconductor substrate.

The vertical driving unit 60 generates a control signal of the pixel circuit of the pixel 110. This vertical driving unit 60 transmits the generated control signal to the pixels 110 through the signal lines 51 in the figure. The column signal processing unit 70 processes image signals generated by the pixels 110. The column signal processing unit 70 processes the image signals transmitted from the pixels 110 through the signal lines 52 in the drawing. The processing in the column signal processing unit 70 corresponds to, for example, analog-to-digital conversion of converting an analog image signal generated in the pixels 110 into a digital image signal. The image signal processed by the column signal processing unit 70 is output as an image signal of the imaging element 1. The control unit 80 controls the imaging element 1 as a whole. The control unit 80 generates and outputs control signals for controlling the vertical driving unit 60 and the column signal processing unit 70 to control the imaging element 1. The control signals generated by the control unit 80 are transmitted to the vertical driving unit 60 and the column signal processing unit 70 through signal lines 81 and 82.

[Cross-Sectional Configuration of Imaging Element]

Figure 3:
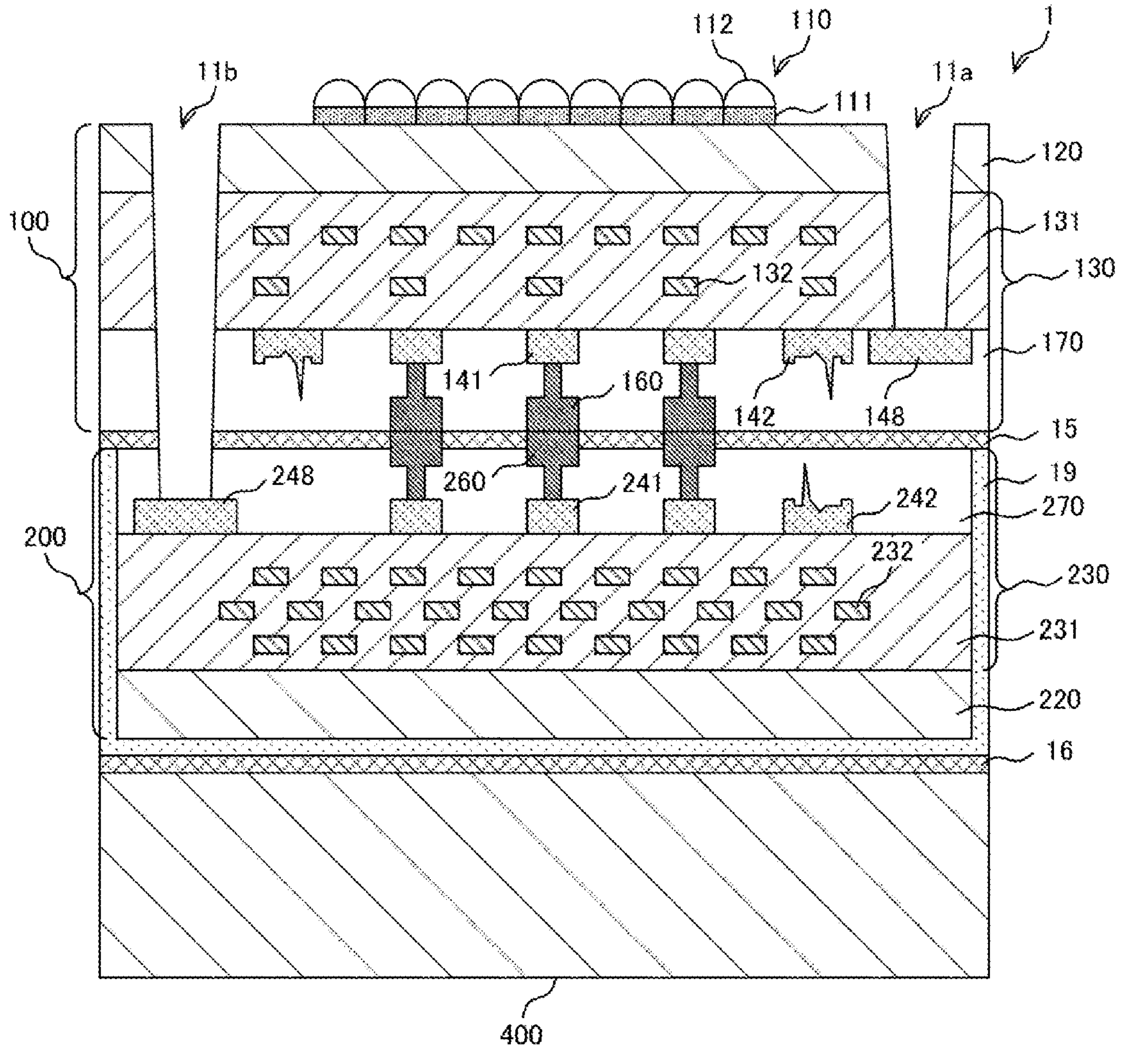
FIG. 3 is a diagram illustrating a configuration example of an imaging element according to a first embodiment of the present disclosure.

FIG. 3 is a diagram illustrating a configuration example of the imaging element according to the first embodiment of the present disclosure. That figure is a schematic cross-sectional view illustrating a configuration example of the imaging element 1. The imaging element 1 is configured by bonding a plurality of semiconductor chips together. Specifically, the imaging element 1 illustrated in that figure includes an imaging chip 100 and a logic chip 200, which are bonded together. Further, the imaging element 1 further includes an oxide film 19, oxide film bonding layers 15 and 16, and a support substrate 400.

The imaging chip 100 is a semiconductor chip in which the pixel array unit 50 having the above-described pixels 110 is disposed, and is also a semiconductor chip that generates an image signal. The imaging chip 100 includes a semiconductor substrate 120 and a wiring region 130.

The semiconductor substrate 120 is a semiconductor substrate on which elements such as the photoelectric conversion unit and the pixel circuit of the pixel 110 are formed. The semiconductor substrate 120 can be formed of, for example, silicon (Si). The photoelectric conversion unit is irradiated with incident light from the back surface side of the semiconductor substrate 120. A color filter 111 and an on-chip lens 112 are disposed for each pixel 110 on the back surface side of the semiconductor substrate 120. The imaging element 1 having this configuration is called a back surface-irradiated imaging element.

The wiring region 130 is a region in which wires for transmitting signals to the elements disposed on the semiconductor substrate 120 are formed. This wiring region 130 is disposed on the front surface side of the semiconductor substrate 120. The wiring region 130 includes an insulating layer 131 and a wiring layer 132. The wiring layer 132 is a wire for transmitting a signal to the elements disposed on the semiconductor substrate 120. The signal lines 51 and the like described with reference to FIG. 2 are formed of the wiring layer 132. The wiring layer 132 can be formed of, for example, a metal such as copper (Cu). The insulating layer 131 insulates the wiring layer 132. This insulating layer 131 can be formed of an insulating material, for example, a silicon oxide ($SiO_2$). Note that the wiring layer 132 and the insulating layer 131 can each be formed as multiple layers. The wiring layers 132 in different layers can be connected to each other by via plugs 133, which will be described later.

In addition, pads are disposed in the wiring region 130. Each pad is an electrode-shaped terminal formed of a metal such as aluminum (Al). Such pads include a pad 141, a test pad 142, and a bonding pad 148, which are disposed.

The pad 141 is a pad which is connected to the wiring layer 132 and through which a signal is transmitted. This pad 141 is also a pad to which a surface pad 160, which will be described later, is connected.

The test pad 142 is a pad for testing the imaging chip 100. As with the pad 141, this test pad 142 is connected to the wiring layer 132, through which a signal is transmitted. Signals to be transmitted through this test pad 142 include a control signal for testing the imaging chip 100 and a signal generated by the imaging chip 100 during the test. In addition, the test pad 142 is formed with a protrusion (protrusion 144, which will be described later) toward a surface for bonding when the imaging chip 100 and the logic chip 200 are bonded together.

The test of the imaging chip 100 can be performed by, for example, a semiconductor test apparatus. The semiconductor test apparatus can input a control signal for test to the imaging chip 100 and detect an output signal such as an image signal from the imaging chip 100 to determine whether the imaging chip 100 is not defective. The yield of the imaging element 1 can be improved by applying to the imaging element 1 the imaging chip 100 determined to be not defective. The input of the control signal and the detection of the output signal can be performed using a test probe. This test probe is provided with a metal needle. By bringing this needle of the test probe into contact with the test pad 142, the needle of the test probe and the test pad 142 are electrically connected to each other, making it possible to transmit a signal for test. At the time of this needle contact, the tip of the needle comes into contact with the test pad 142. A film such as an oxide is formed on the front surface of the test pad 142. In order to penetrate this film and come into contact with the metal portion of the test pad 142, the needle of the test probe is brought into contact with the test pad 142 by a relatively high pressure. As a result, a needle mark remains on the front surface of the test pad 142 after the test. Specifically, unevenness as shown in the figure is formed on the front surface of the test pad 142 after the test.

The bonding pad 148 is a pad to which the bonding wire 30 described with reference to FIG. 1 is connected. On the back surface of the bonding pad 148, an opening 11*a* that penetrates the semiconductor substrate 120 and the wiring region 130 from the back surface side of the imaging chip 100 is disposed. Wire bonding is performed through this opening 11*a*.

An insulating film 170 is a film that insulates the test pad 142. Further, the insulating film 170 is disposed between the test pad 142 and the surface for bonding to protect the test pad 142. This insulating film 170 can be formed of an insulating material. Specifically, the insulating film 170 can be formed of an oxide such as $SiO_2$. Further, the insulating film 170 may be formed to contain a nitride such as silicon nitride (SiN). As described above, unevenness is formed on the front surface of the test pad 142 after the test. If this protrusion interferes with a pad or the like of the facing logic chip 200, the semiconductor chip may be damaged or a malfunction may occur due to signal leakage. Therefore, the test pad 142 is disposed at a position deep from the front surface of the imaging chip 100 and is covered with the insulating film 170. This makes it possible to prevent the occurrence of problems such as damage to the logic chip 200.

The insulating film 170 is formed to have a thickness to cover the above-described protrusion. If the thickness of this insulating film 170 is insufficient, a void may be formed near the tip of the protrusion in the insulating film 170. This void becomes a drawback when the imaging chip 100 and the logic chip 200 are bonded together. Further, Cu, which is a material for the surface pad 160 described later, may diffuse from this void to the wiring region 130. Further, when the void is formed, Al, which is the material of the protrusion, may diffuse when the surface pad 160 is formed, and thus contaminate the manufacturing apparatus. In order to prevent such drawbacks, the insulating film 170 needs to be formed to have a predetermined film thickness. Details of the insulating film 170 will be described later.

The surface pad 160 is a pad which is disposed on the front surface of the wiring region 130 and through which a signal is transmitted. The surface pad 160 illustrated in the figure is an example in which it is disposed on the front surface of the wiring region 130 via the pad 141 and through which a signal is transmitted. Further, the surface pad 160 is joined to a surface pad (a surface pad 260 described later) of the logic chip 200 when the imaging chip 100 and the logic chip 200 are bonded together. A signal can be transmitted between the imaging chip 100 and the logic chip 200 via the surface pad 160 and the surface pad 260, which are joined to each other. The surface pad 160 can be made of Cu. As will be described later, the surface pad 160 can be formed to have a different size from the test pad 142.

Note that the pad 141, the test pad 142, the bonding pad 148, and the surface pad 160 can also be regarded as parts of the wires disposed in the wiring region 130. Further, the insulating film 170 can be regarded as a part of the insulating layer disposed in the wiring region 130. The surface pad is an example of a first pad recited in the claims. The test pad 142 is an example of a second pad recited in the claims The bonding pad 148 is an example of a third pad recited in the claims.

The logic chip 200 is a semiconductor chip in which a processing circuit for processing an image signal generated by the imaging chip 100 is disposed. Further, a control circuit for generating a control signal of the imaging chip 100 can be disposed in the logic chip 200. The vertical driving unit 60, the column signal processing unit 70, and the control unit 80, which are described with reference to FIG. 2, can be disposed in the logic chip 200. The logic chip 200 includes a semiconductor substrate 220 and a wiring region 230.

As with the semiconductor substrate 120, the semiconductor substrate 220 is a semiconductor substrate Elements such as the vertical driving unit 60 and the column signal processing unit 70 can be formed on this semiconductor substrate 220.

As with the wiring region 130, the wiring region 230 is a region in which wires for transmitting signals to the elements disposed in the semiconductor substrate 220 are formed, and includes an insulating layer 231 and a wiring layer 232.

In addition, a pad 241, a test pad 242, and a bonding pad 248 are disposed in the wiring region 230. As with the pad 141, the pad 241 is a pad through which a signal is transmitted. As with the test pad 142, the test pad 242 is a pad through which a signal for test of the logic chip 200 is transmitted. As with the bonding pad 148, the bonding pad 248 is a pad to which the bonding wire 30 is connected. Unlike the bonding pad 148, an opening 11*b* is formed on the front surface of the bonding pad 248. This opening 11*b* is an opening that penetrates the imaging chip 100 and an insulating film 270, which will be described later. Wire bonding of the bonding pad 248 disposed on the logic chip 200 is performed through the opening 11*b*. The pad 241, the test pad 242, and the bonding pad 248 can be made of A1.

As with the insulating film 170, the insulating film 270 is a film that insulates and protects the test pad 242. This insulating film 270 can be formed of an oxide such as $SiO_2$ or a nitride such as SiN.

As with the surface pad 160, the surface pad 260 is a pad which is disposed on the surface of the wiring region 230 and through which a signal is transmitted, and is also a pad joined to the surface pad 160. The surface pad 260 can be made of Cu.

Note that the pad 241, the test pad 242, the bonding pad 248, and the surface pad 260 can also be regarded as parts of the wires disposed in the wiring region 230. Further, the insulating film 270 can be regarded as a part of the insulating layer disposed in the wiring region 230. Further, the surface pad 260 is an example of the first pad recited in the claims. The test pad 242 is an example of the second pad recited in the claims. The bonding pad 248 is an example of the third pad recited in the claims The oxide film bonding layer 15 is disposed between the imaging chip 100 and the logic chip 200 to bond the imaging chip 100 and the logic chip 200. This oxide film bonding layer 15 is formed of an oxide such as $SiO_2$ to bond the imaging chip 100 and the logic chip 200 by oxide film bonding. In this oxide film bonding, the surface of an oxide such as $SiO_2$ is activated by plasma treatment or the like, and oxide films thus activated are bonded together by heat and pressure contact. In the imaging element 1 illustrated in the figure, the oxide film bonding is performed between the oxide film bonding layer 15 disposed on the surface of the wiring region 230 of the logic chip 200 and the wiring region 130 of the imaging chip 100. For the case where the surfaces of the insulating film 170 of the imaging chip 100 and the insulating film 270 of the logic chip 200 are formed of an oxide, the oxide film bonding layer 15 may be eliminated so that the oxide film bonding is performed between the insulating films 170 and 270.

The oxide film 19 is an oxide film that surrounds the logic chip 200. The oxide film 19 protects the logic chip 200. The oxide film 19 can be made of $SiO_2$.

The support substrate 400 is a substrate that supports the imaging chip 100 and the logic chip 200. For this support substrate 400, a Si substrate can be used. The support substrate 400 is bonded to the logic chip 200 by the oxide film bonding layer 16.

As described above, the insulating film 170 of the imaging chip 100 and the insulating film 270 of the logic chip 200 are bonded through the oxide film bonding layer 15. At this time, the facing surface pads 160 and 260 are aligned and heat-pressed to be joined to each other. This makes it possible to bond the imaging chip 100 and the logic chip 200 together. Between the imaging chip 100 and the logic chip 200, the wiring region 130 and the wiring region 230 are bonded together through the oxide film bonding layer 15 and the insulating films 170 and 270.

By disposing the test pads 142 and 242 at positions deep from the interface where the imaging chip 100 and the logic chip 200 are bonded together and by disposing the insulating films 170 and 270 thereon, the pads can be prevented from coming into contact with the semiconductor chip facing them. This makes it possible to dispose the test pads 142 and 242 at opposite positions in the imaging chip 100 and the logic chip 200, which are bonded together. The test pads 142 and 242 illustrated on the right side in the figure show this opposite relationship. Note that, like the test pad 142 illustrated on the left side in the figure, there may be no opposing test pad 242.

[Configuration of Pad]

Figure 4:
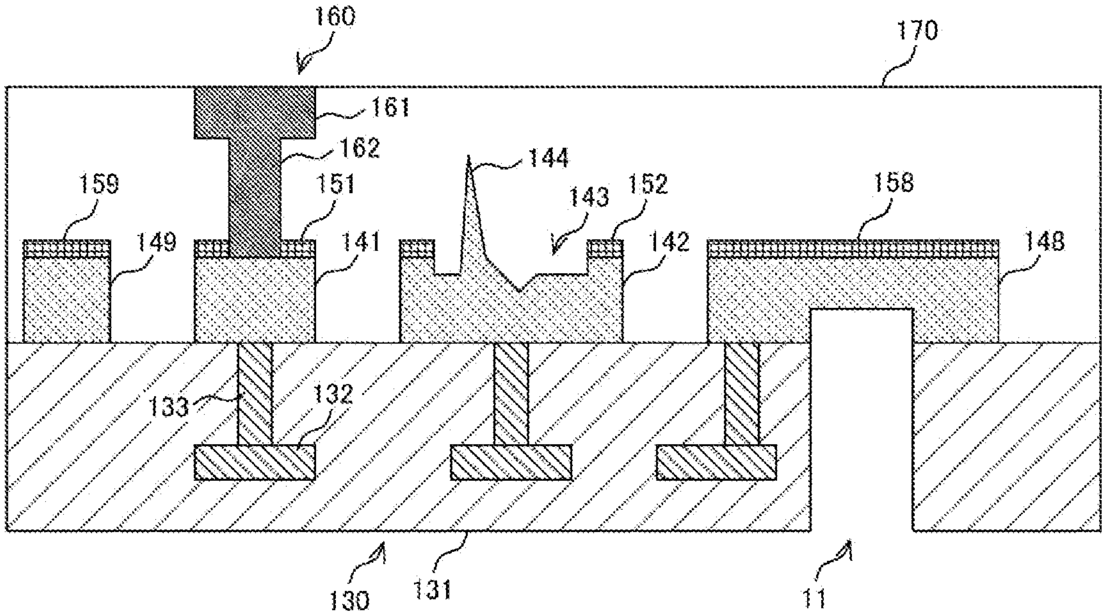
FIG. 4 is a diagram illustrating a configuration example of pads according to the first embodiment of the present disclosure.

FIG. 4 is a diagram illustrating a configuration example of the pads according to the first embodiment of the present disclosure. That figure is a schematic cross-sectional view illustrating a configuration example of the test pad 142 and others. As illustrated in the figure, the pad 141, the test pad 142, and the bonding pad 148 can be disposed in the same layer in the wiring region 130. Further, the pad 141, the test pad 142, and the bonding pad 148 are each connected to the wiring layer 132. The pad 141 or the like and the wiring layer 132 are connected by the via plug 133. The via plug 133 is formed of a columnar metal and connects the wiring layers 132 which are different layers and also connects the wiring layer 132 and the pad 141 and others.

Further, a protective metal film can be disposed on the surfaces of the pad 141, the test pad 142, and the bonding pad 148. This protective metal film is a metal film that protects the pad 141 and others, and can be formed of laminated films of titanium (Ti) and titanium nitride (TiN). Alternatively, laminated films of tantalum (Ta) and tantalum nitride (TaN) may be used. A protective metal film 151 is disposed on the surface of the pad 141, a protective metal film 152 is disposed on the surface of the test pad 142, and a protective metal film 158 is disposed on the surface of the bonding pad 148.

The surface pad 160 is disposed on the surface of the pad 141. This surface pad 160 is composed of a pad 161 and a via plug 162. The pad 161 is a pad embedded in the insulating film 170, and is also a pad adjacent to the surface of the wiring region 130. The via plug 162 connects the pads 141 and 161. The figure illustrates an example in which one via plug 162 is disposed between the pads 141 and 161. A plurality of via plugs 162 may be disposed between the pads 141 and 161.

The pad 161 and the via plug 162 can be made of Cu and also formed simultaneously. For example, the pad 161 and the via plug 162 can be formed by Cu plating. Specifically, it can be formed by the following procedure. First, openings with the shapes of the pad 161 and the via plug 162 are formed in the insulating film 170. Next, a protective layer (not illustrated) for preventing the diffusion of Cu is formed in this opening. Next, a seed layer (not illustrated) is disposed adjacent to the insulating film, and then plating is performed so that a Cu film is disposed on the surface of the insulating film 170 having the opening. After that, the Cu film on the surface of the insulating film 170 is ground to remove the Cu other than the opening, so that the surface pad 160 can be formed. Polishing the Cu can be performed by Chemical Mechanical Polishing (CMP). Note that, when the opening is formed, the protective metal film 151 is partially removed.

As described above, the test pad 142 is a pad with which the needle of the test probe for test is brought into contact. The contact of the needle of the test probe makes a protrusion 144 on the test pad 142. By disposing the test pad 142 at a position deep from the surface of the surface pad 160, the protrusion 144 can be prevented from coming into contact with the logic chip 200 to be bonded. Further, by disposing the insulating film 170, the test pad 142 formed with the protrusion 144 can be protected. Further, the insulating film 170 can protect the logic chip 200 from the protrusion 144 of the test pad 142.

Note that the test pad 142 illustrated in the figure is an example in which a recess 143 is formed in a region with which the needle of the test probe is brought into contact. By disposing the recess 143, the tip of the protrusion 144 after the test can be disposed at a position deeper from the surface of the surface pad 160, making it possible to secure a margin.

As described above, the bonding pad 148 is a pad to which the bonding wire 30 is connected. The opening 11 is formed on the back side of the bonding pad 148. When this opening 11 is formed, a part of the bonding pad 148 is removed to form a recess.

Referring to the figure, an imitation pad 149 is also disposed. This imitation pad 149 is a pad through which any signal is not transmitted and is not connected to the wiring layer 132. This imitation pad 149 is a so-called dummy pad, and is also a pad that is disposed in a region where any of the pad 141 and others is not disposed and is used to make the thickness of the insulating film 170 and others uniform. A protective metal film 159 is disposed on the surface of the imitation pad 149.

The imitation pad 149, the pad 141, the surface pad 160, the test pad 142, and the bonding pad 148 can be formed to have different sizes. In order to allow the needle of the probe for test to come into contact with, the test pad 142 may be formed to have a relatively large size in plan view. On the other hand, the surface pad 160 is formed to have a relatively small size. This is to reduce the dishing during CMP in a manufacturing process, which will be described later. The pad 141 on which this surface pad 160 is disposed is also formed to have a relatively small size. Accordingly, the test pad 142 can be formed to have a size larger than the surface pad 160. Further, the bonding pad 148 is formed to have a relatively large size for wire bonding. Further, the imitation pad 149 can be formed to have a width of approximately 3 μm, for example. Further, the pad 141 and the surface pad 160 can each be formed to have a width of approximately 5 μm, for example. Further, the test pad 142 can be formed to have a width of 50 μm or less, for example. Further, the bonding pad 148 can be formed to have a width of 50 to 100 μm, for example. In this way, each pad can be formed to have a size suitable for the purpose of use of the pad.

[Test Using Test Pad]

Figure 5:
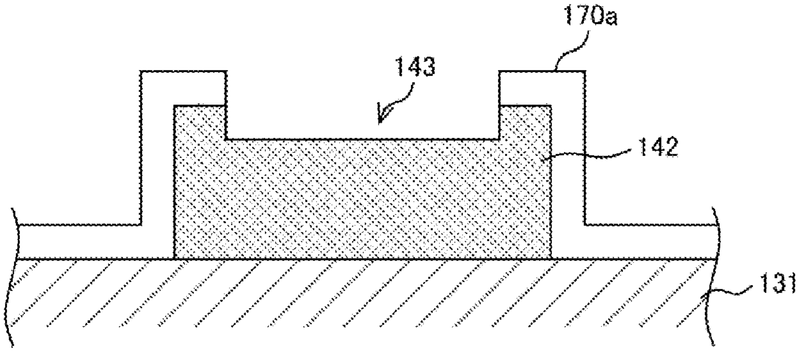
FIG. 5 is a diagram illustrating an example of a test according to an embodiment of the present disclosure.
Figure 5:
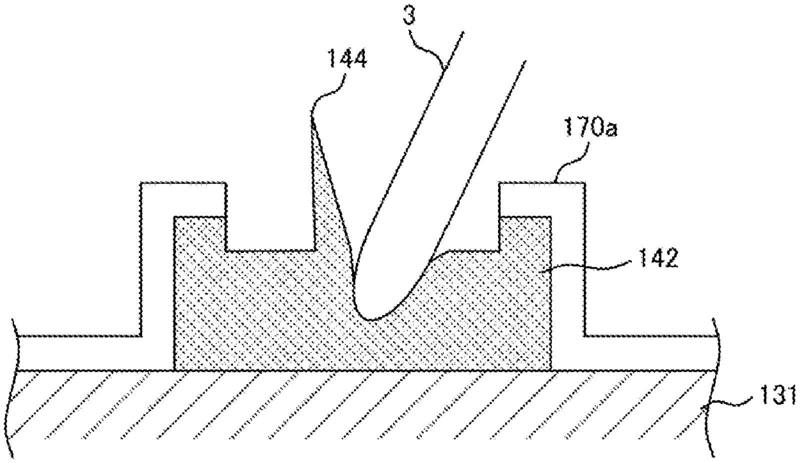
Figure 5:
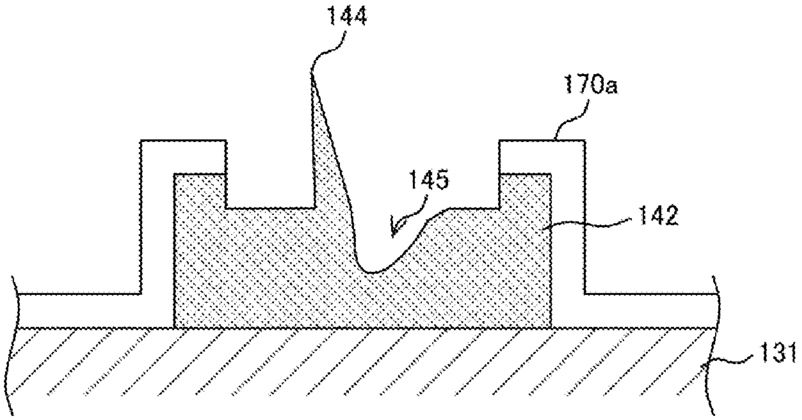

FIG. 5 is a diagram illustrating an example of a test according to the embodiment of the present disclosure. That figure is a diagram showing the state of the test using the test pad 142. Meanwhile, in the figure, the protective metal film 152 is not illustrated.

A of the figure shows the test pad 142 before the test. The recess 143 is formed on the front surface of the test pad 142. A thin insulating film 170*a* is disposed on the front surface and side surfaces of the test pad 142, which are regions other than this recess 143.

B of the figure shows the test pad 142 under the test. At the start of the test, a needle 3 of a test probe is brought into contact with the recess 143 of the test pad 142. At this time, the tip of the needle 3 pierces the front surface of the test pad 142. As a result, Al, which is the material of the test pad 142, rises to form the protrusion 144.

C of the figure shows the test pad 142 after the test. The needle 3 of the test probe is removed, and a recess 145, which is a needle mark, is formed on the front surface of the test pad 142. By performing the test in this way, the protrusion 144 is formed on the test pad 142.

[Configuration of Insulating Film]

Figure 6:
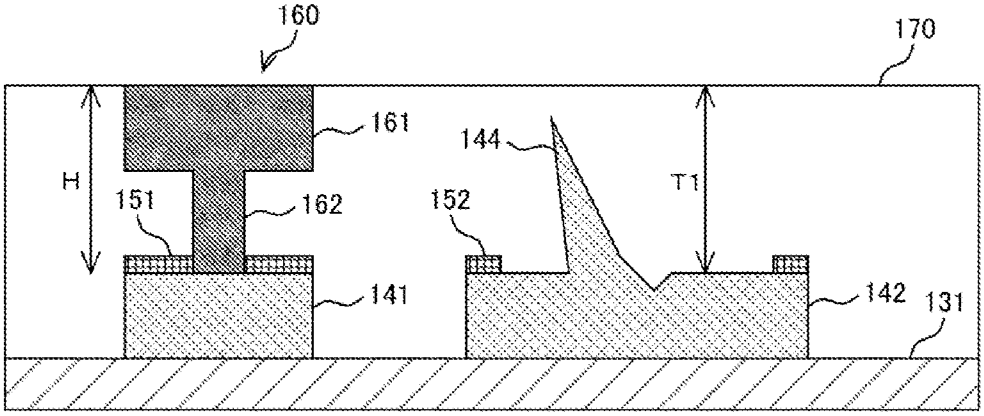
FIG. 6 is a diagram illustrating configuration examples of an insulating film according to the first embodiment of the present disclosure.
Figure 6:
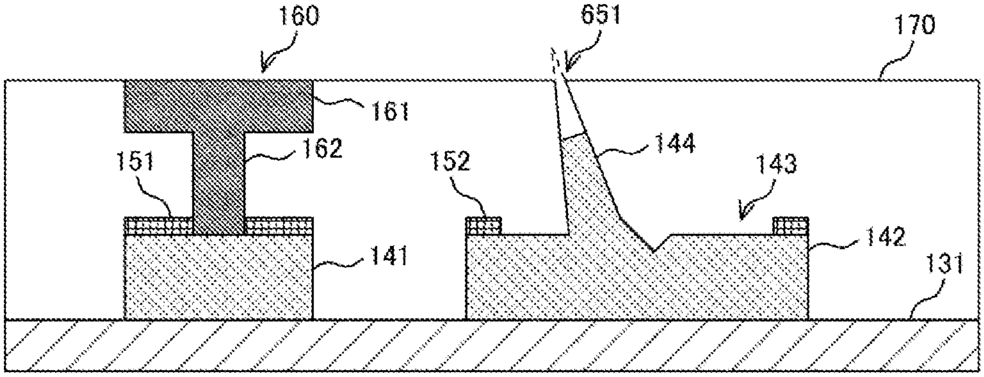
Figure 6:
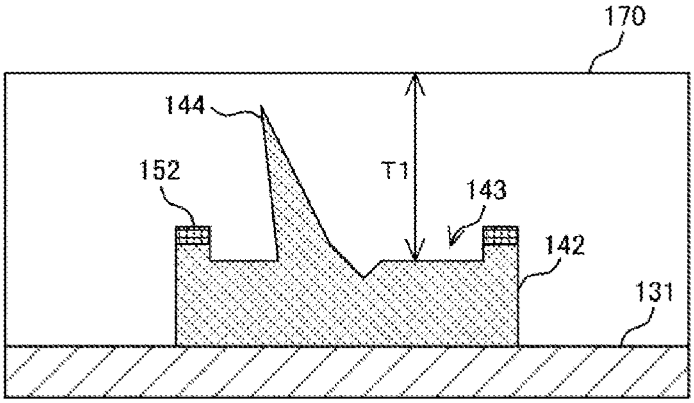

FIG. 6 is a diagram illustrating a configuration example of an insulating film according to the first embodiment of the present disclosure. That figure is a diagram illustrating a configuration example of the insulating film 170. A of the figure shows an example of the insulating film 170. In A of the figure, the insulating film 170 is disposed between the front surface of the test pad 142 and the surface of the wiring region 130. Accordingly, the thickness of the insulating film 170 above the front surface of the test pad 142 is a thickness corresponding to the height from the front surface of the test pad 142 to the surface of the wiring region 130. In order to form the insulating film 170 in a shape to cover the protrusion 144 on the front surface of the test pad 142, it is necessary to design the thickness T1 of the insulating film 170 to be set to a value larger than the height of the protrusion 144 and including a margin according to the manufacturing process. The thickness T1 of this insulating film 170 may be set to 650 nm or more, for example. In this case, the height H of the surface pad 160 from the front surface of the pad 141 is substantially the same as the thickness T1, which is the thickness of the insulating film 170.

B of the figure shows an example in which the thickness of the insulating film 170 is insufficient. As described above, in manufacturing the surface pad 160, the Cu film of the surface pad 160 and the insulating film 170 are ground by CMP. In the CMP, chemical liquid (polishing liquid) containing a polishing agent is used. If the thickness of the insulating film 170 is insufficient, a void (void 651) may be formed near the protrusion 144 in the insulating film 170. This void 651 causes a reduction in strength in bonding the imaging chip 100 and the logic chip 200 together. Further, if Cu, which is the material of the surface pad 160, is embedded in the void 651 and diffuses into the wiring region 130 accordingly, it causes a reduction and the like in the insulation resistance of the insulating layer 131. B of the figure shows an example in which the protrusion 144 of the test pad 142 is melted out by the chemical liquid for the CMP and as a result, the void 651 is formed. A dotted line in B of the figure represents the protrusion 144 melted out. The melted-out Al, which is the material of the test pad 142, may contaminate the CMP polishing apparatus and the semiconductor chip. In order to prevent the occurrence of such a defect, it is necessary to apply the above-mentioned value to the thickness T1 of the insulating film 170.

C of the figure shows an example in which the recess 143 is formed on the front surface of the test pad 142. When the recess 143 is formed, the thickness T1 of the insulating film 170 corresponds to the height from the bottom surface of the recess 143 to the surface of the wiring region 130.

[Another Configuration of Insulating Film]

Figure 7:
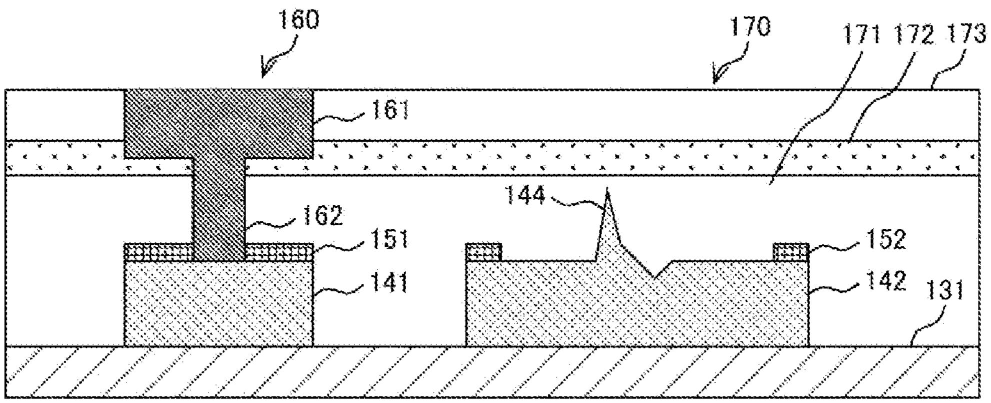
FIG. 7 is a diagram illustrating another configuration example of the insulating film according to the first embodiment of the present disclosure.

FIG. 7 is a diagram illustrating another configuration example of the insulating film according to the first embodiment of the present disclosure. The insulating film 170 illustrated in the figure differs from the insulating film 170 illustrated in FIG. 6 in that it is formed of a plurality of insulating material layers. The insulating film 170 illustrated in the figure is composed of insulating material films 171 to 173. The insulating material films 171 and 173 can each be formed of a $SiO_2$ film. The insulating material film 172 can be formed of a SiN film. In other words, the insulating film 170 illustrated in the figure is composed of $SiO_2$ films and a SiN film therebetween. The insulating material film 172 made of SiN is a film that protects the test pad 142, as with the insulating material films 171 and 173. Further, the insulating material film 172 can also be used as an etching stopper film in the process of CMP polishing in manufacturing the surface pad 160. Further, by disposing the insulating material film 172 film, the warp of the semiconductor substrate 120 can be reduced.

[Method of Manufacturing Imaging Chip]

FIGS. 8 to 11 are diagrams illustrating an example of a method for manufacturing the imaging chip according to the first embodiment of the present disclosure. FIGS. 8 to 11 are also diagrams illustrating an example of a process of manufacturing the imaging chip 100. Taking the imaging chip 100 as an example, the process of manufacturing the semiconductor chip according to the embodiment of the present disclosure will be described.

Figure 8:
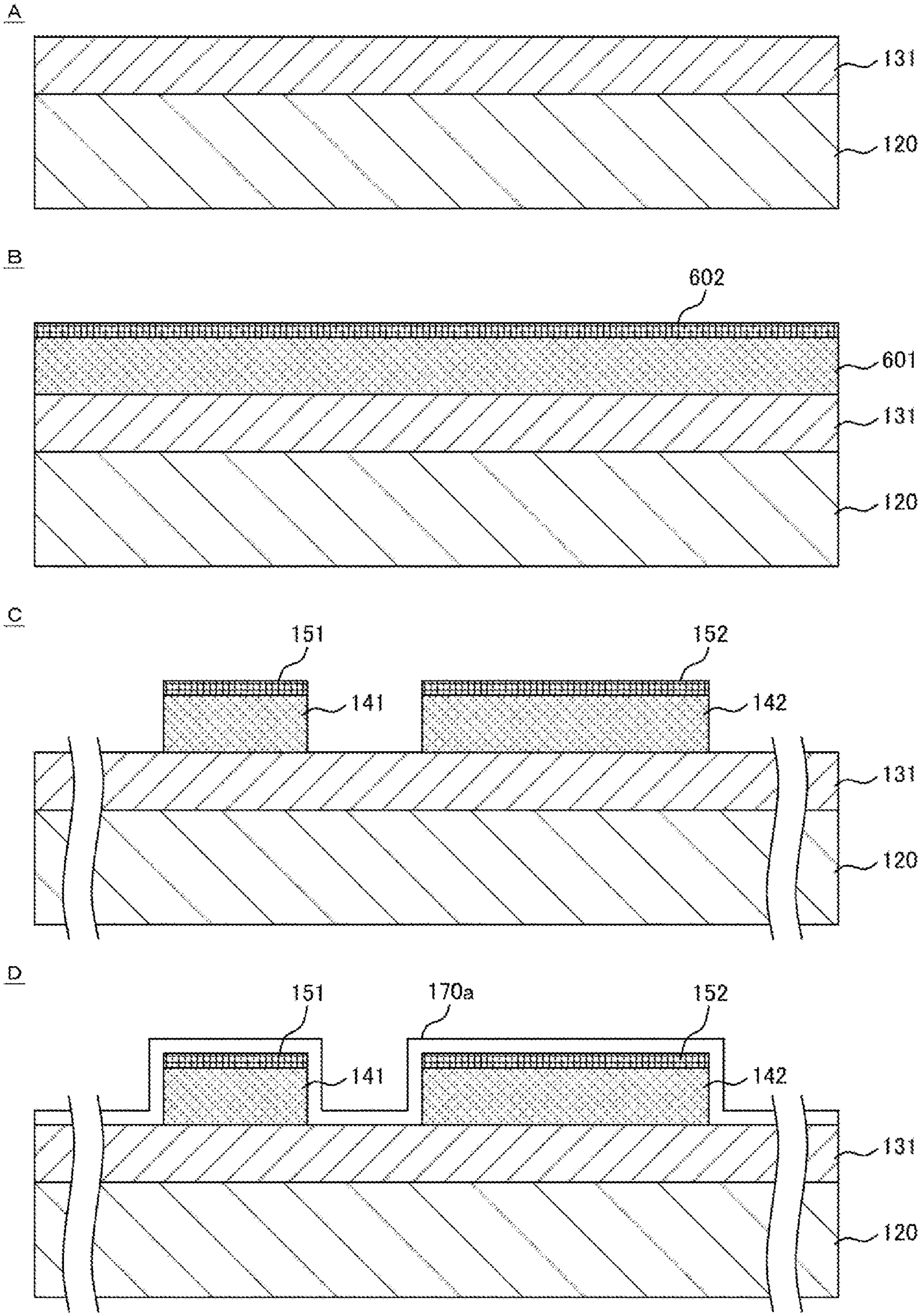
FIG. 8 is a diagram illustrating an example of a method for manufacturing an imaging chip according to the first embodiment of the present disclosure.

First, elements such as the photoelectric conversion unit are formed on the semiconductor substrate 120 wafer-shaped, and the insulating layer 131 and the wiring layer 132 (not illustrated) in the wiring region 130 (A of FIG. 8). This step is an example of a step of disposing a photoelectric conversion unit recited in the claims.

Next, a material film 601 for the pad 141 and others is formed on the surface of the insulating layer 131. This can be achieved, for example, by forming an Al film by sputtering or the like. Next, a material film 602 for the protective metal film 151 and others is formed. This can be achieved, for example, by laminating a Ti film and a TiN film one on another by sputtering or the like (B of FIG. 8).

Next, the pad 141 and the test pad 142 are formed. This can be achieved by disposing a resist in a region on the surface of the material film 602 where the pad 141 and others are to be disposed, and using this resist as a mask to etch the material films 601 and 602 other than the region where the pad 141 is to be disposed (C of FIG. 8). This step is an example of a step of disposing a second pad recited in the claims Next, the thin insulating film 170*a* is disposed on the surface of the wiring region 130 including the pad 141 and others. This can be achieved, for example, by forming a film of $SiO_2$ which is a material of the insulating film 170*a* by chemical vapor deposition (CVD) (D of FIG. 8).

Next, the insulating film 170*a* and the protective metal film 152 where are at the central area of the surface of the test pad 142 are removed. This can be achieved by dry etching. By this etching, the recess 143 can be formed (E of FIG. 9).

Next, the imaging chips 100 wafer-arranged are each tested. The needle 3 of the test probe is brought into contact with the test pad 142 to and from which an test signal is input and output (F of FIG. 9). This step is an example of a step of testing recited in the claims.

The position of a non-defective chip(s) among the wafer-arranged imaging chips 100 after the test is acquired. As a result, non-defective imaging chips 100 are selected (G of FIG. 9).

Next, the insulating film 170 (insulating film 170*b*) is disposed on the surface of the insulating layer 131. This insulating film 170*b* is an insulating film having a thickness to cover the pad 141 and the test pad 142 (H of FIG. 10). This step is an example of a step of forming an insulating film recited in the claims.

Next, openings 603 and 604 are formed in the insulating film 170 adjacent to the pad 141. The openings 603 and 604 are openings for the via plug 162 and the pad 161 respectively. This can be achieved, for example, by using dry etching to remove the insulating film 170 in the regions of the openings 603 and 604 (I of FIG. 10).

Next, a material film 605 for the surface pad 160 is disposed on the surface of the insulating film 170. At this time, the material film 605 is also disposed in the openings 603 and 604. This can be achieved by plating a Cu film (J of FIG. 11). Next, the material film 605 disposed on the surface of the insulating film 170, excluding the openings 603 and 604, is removed. This can be achieved by CMP. Accordingly, the via plug 162 and the pad 161 can be formed, completing the surface pad 160 (K of FIG. 11). This step is an example of a step of disposing a first pad recited in the claims.

By the above-described steps, the imaging chips 100 wafer-arranged can be manufactured. By similar steps, the logic chips 200 wafer-arranged can be formed. After that, by dicing the wafer on which the logic chips 200 are arranged, the logic chips 200 can be separated into their individual pieces. Note that separating the imaging chips 100 into their individual pieces can be performed after the logic chips 200 are bonded to the imaging chips 100.

[Method of Manufacturing Imaging Element]

FIGS. 12 to 15 are diagrams illustrating an example of a method for manufacturing the imaging element according to the first embodiment of the present disclosure. FIGS. 12 to 15 are also diagrams illustrating an example of a process of manufacturing the imaging element 1.

First, the logic chips 200 determined to be non-defective products as a result of the test are disposed on a rearrangement substrate 606. At this time, the plurality of logic chips 200 are disposed so as to be aligned with the imaging chips 100 wafer arranged. Each logic chip 200 can be fixed by an adhesive 607 disposed on the rearrangement substrate 606 (A of FIG. 12).

Next, a support substrate 608 on which the oxide film bonding layer 15 is disposed is disposed on the surface of the insulating film 270 of the logic chip 200 and then bonded. This can be achieved by oxide film bonding (B of FIG. 12).

Figure 12:
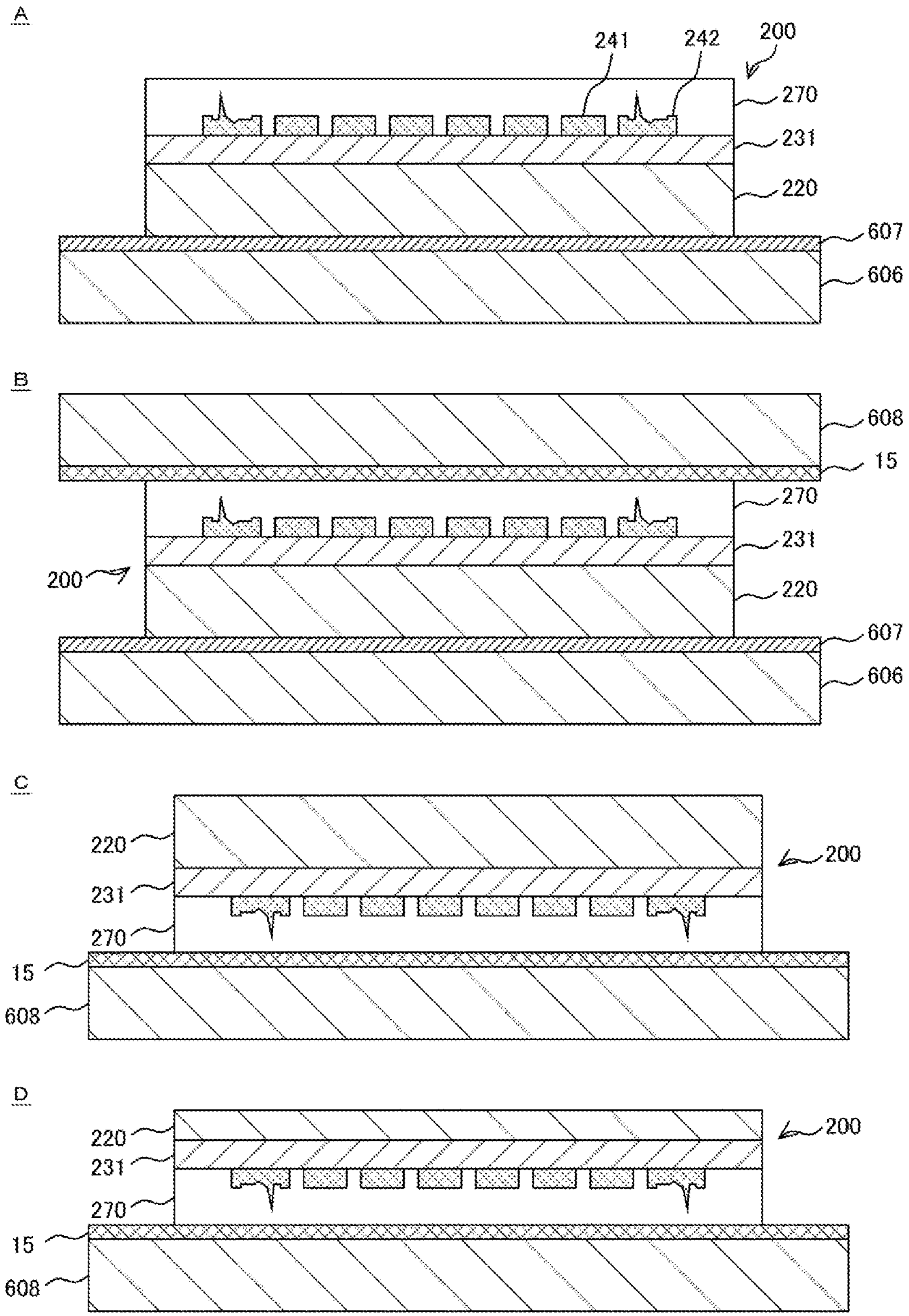
FIG. 12 is a diagram illustrating an example of a method of manufacturing the imaging element according to the first embodiment of the present disclosure.
Figure 13:
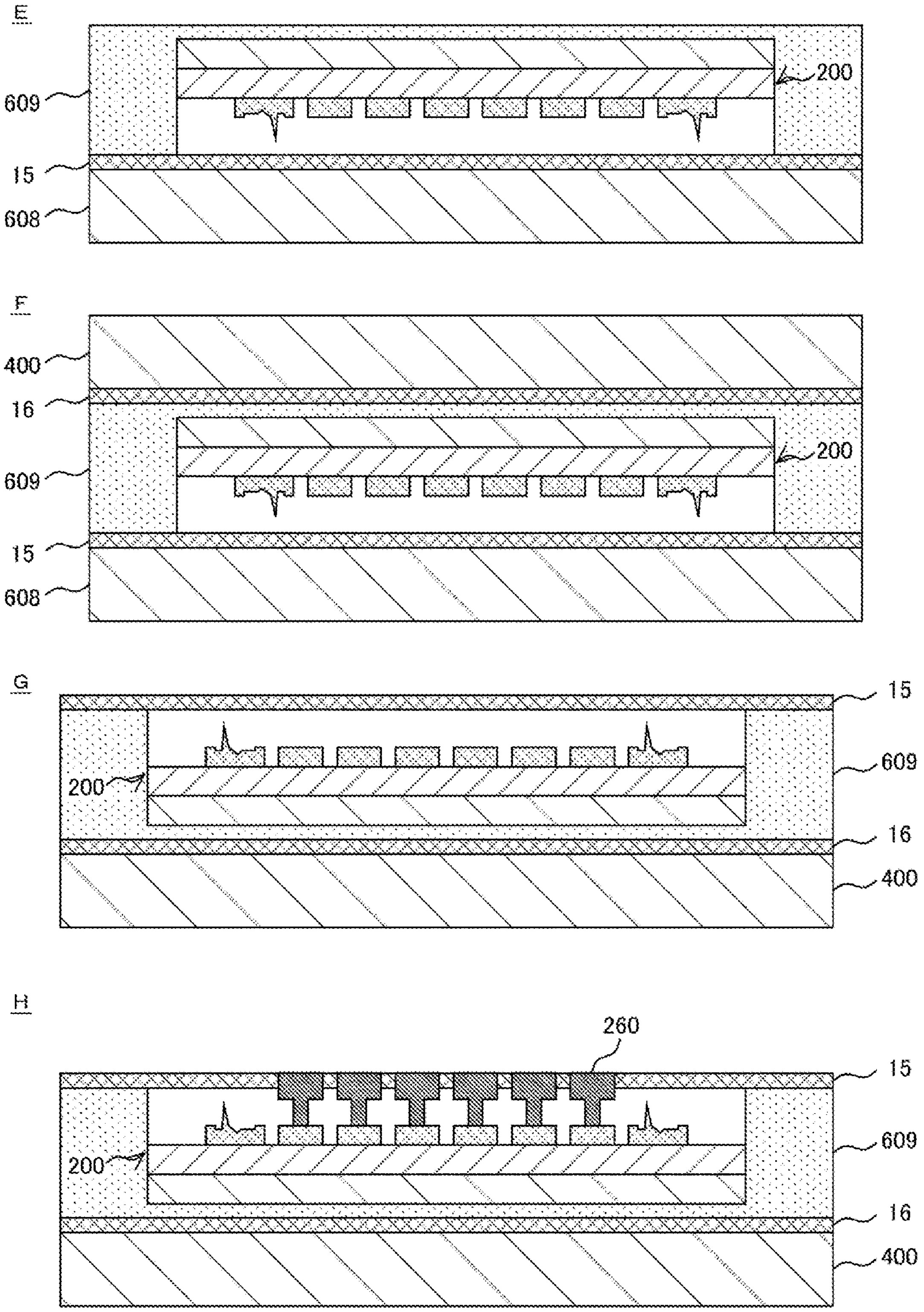
FIG. 13 is a diagram illustrating the example of the method of manufacturing the imaging element according to the first embodiment of the present disclosure.

Next, the support substrate 608 on which the logic chips 200 are disposed is turned upside down, and then the rearrangement substrate 606 and the adhesive 607 are removed (C of FIG. 12).

Next, the back surface side of the semiconductor substrate 220 is ground to be thinned. This can be achieved by CMP, for example (D of FIG. 12).

Next, an oxide film 609 is disposed around the logic chip 200. This can be achieved, for example, by disposing a $SiO_2$ film by CVD. Next, the surface of the oxide film 609 is ground and flattened (E of FIG. 13).

Next, the support substrate 400 on which the oxide film bonding layer 16 is disposed is bonded to the surface of the oxide film 609. This can be achieved by oxide film bonding (F of FIG. 13).

Next, the support substrate 608 is turned upside down, and then the support substrate 400 is removed. This can be achieved by etching the support substrate 608, for example (G of FIG. 13).

Next, the surface pad 260 is disposed on the logic chip 200. This can be achieved by the step shown in I of FIG. 10 to the step shown in K of FIG. 11 (H of FIG. 13).

Next, the imaging chip 100 is bonded to the logic chip 200. This can be achieved by bonding the wafer-arranged imaging chips 100 described with reference to K of FIG. 11 to the logic chips 200 disposed on the support substrate 400. This bonding is achieved by oxide film bonding (I of FIG. 14). This step is an example of a step of bonding recited in the claims.

Figure 14:
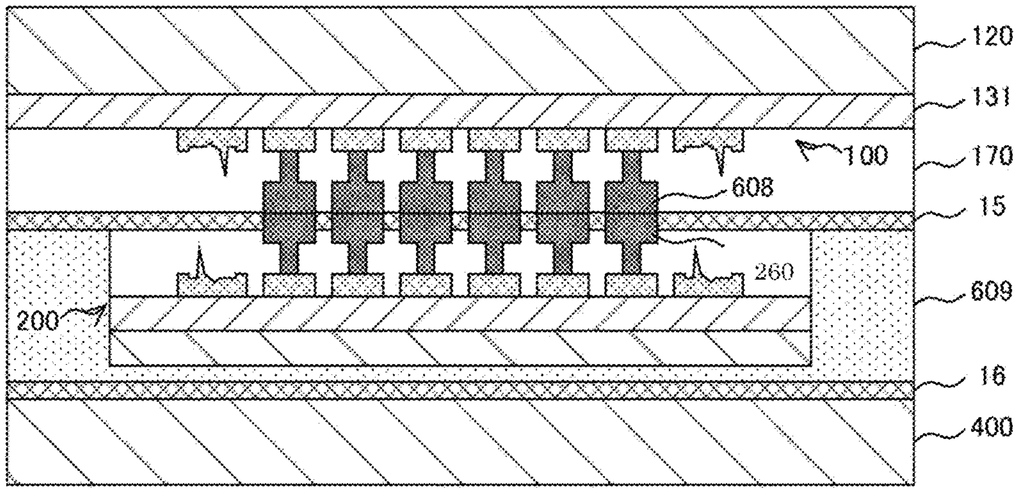
FIG. 14 is a diagram illustrating the example of the method of manufacturing the imaging element according to the first embodiment of the present disclosure.
Figure 14:
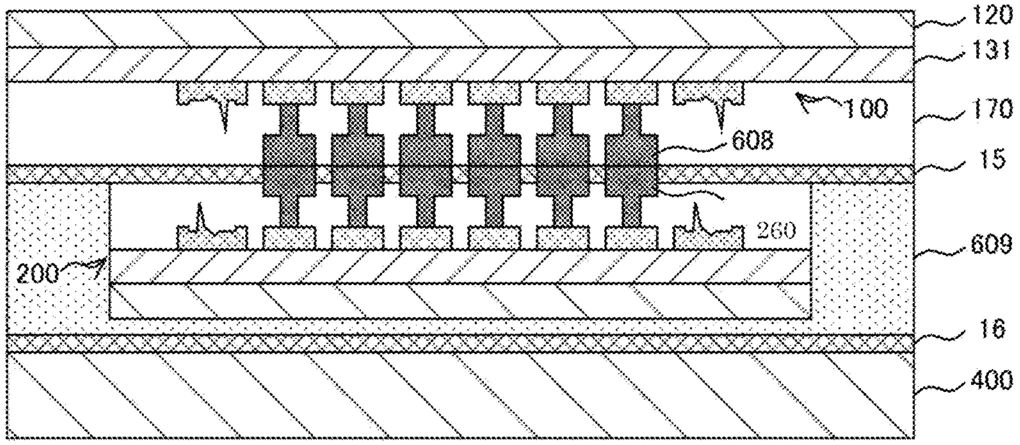

Next, the back surface side of the semiconductor substrate 120 of the imaging chip 100 is ground to be thinned (J of FIG. 14).

Figure 15:
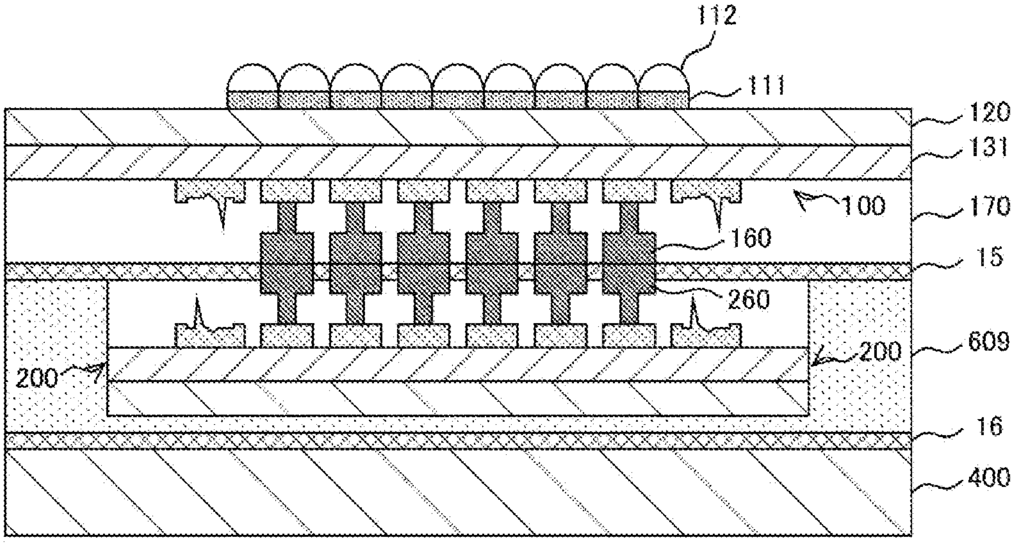
FIG. 15 is a diagram illustrating the example of the method of manufacturing the imaging element according to the first embodiment of the present disclosure.
Figure 15:
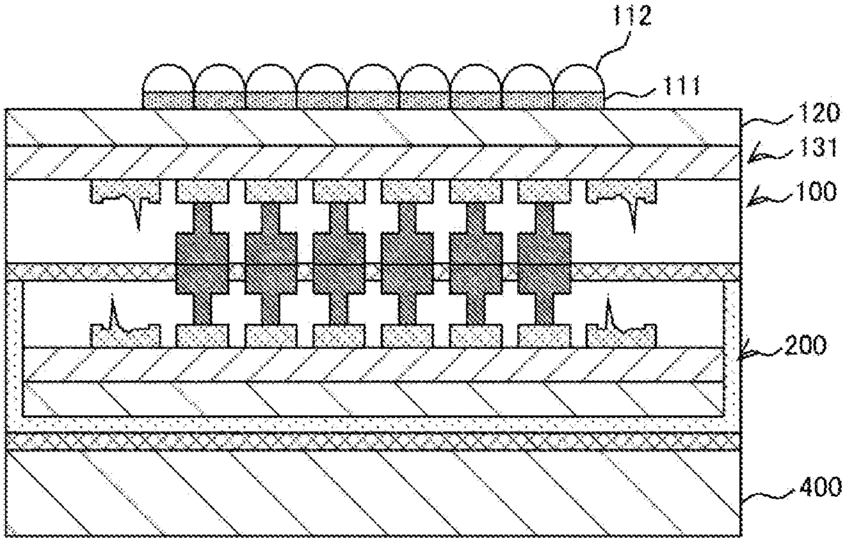

Next, the color filter 111 and the on-chip lens 112 are disposed for each pixel 110 on the semiconductor substrate 120 of the imaging chip 100 (K of FIG. 15). In addition, the openings 11 (not illustrated) are formed.

Next, the imaging chips 100 and the logic chips 200, which are bonded together, are separated into their individual pieces (L of FIG. 15). Accordingly, it is possible to manufacture the imaging element 1.

<Another Configuration of Imaging Element>

Figure 16:
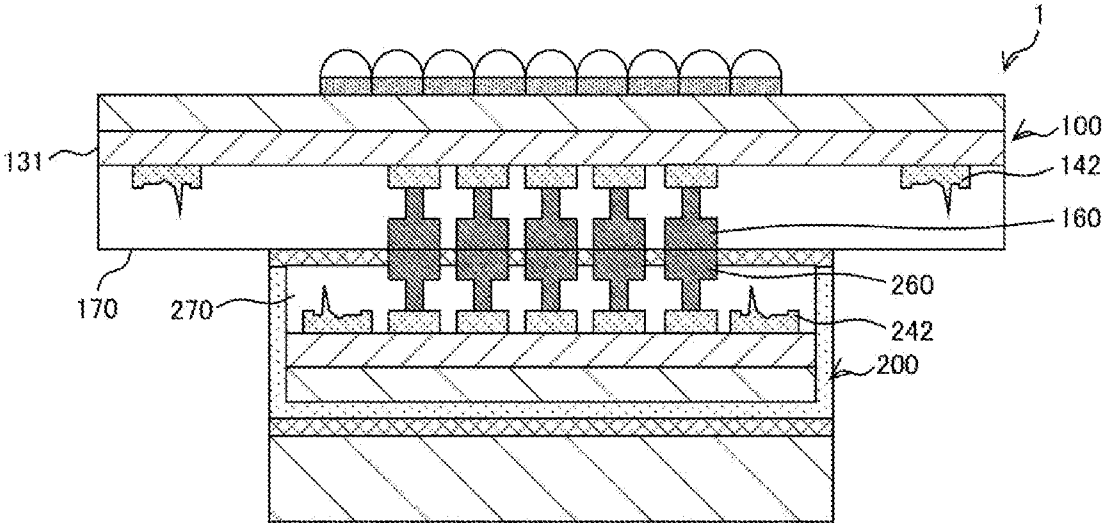
FIG. 16 is a diagram illustrating another configuration example of the imaging element according to the first embodiment of the present disclosure.

FIG. 16 is a diagram illustrating another configuration example of the imaging element according to the first embodiment of the present disclosure. That figure is a schematic cross-sectional view illustrating a configuration example of the imaging element 1, similar to FIG. 3. It differs from the imaging element 1 of FIG. 3 in that the sizes of the imaging chip 100 and the logic chip 200 are different from each other.

Shown in the figure is an example in which the logic chip 200 is formed to have a size smaller than the imaging chip 100. The test pad 242 is disposed in the logic chip 200, and the insulating film 270 is disposed between the test pad 142 and the back surface of the logic chip 200.

In the imaging chip 100 illustrated in the figure, the test pad(s) 142 can be disposed at a position not facing the logic chip 200. In this case, the insulating film 170 around the test pad 142 may be eliminated.

As described above, in the imaging element 1 according to the first embodiment of the present disclosure, the needle 3 of the test probe is brought into contact with the test pads 142 and 242 disposed on the imaging chip 100 and the logic chip 200, respectively, to test the chips. The imaging chip 100 and the logic chip 200 which have been subjected to the test are bonded together to form the imaging element 1. Prior to this bonding, the insulating films 170 and 270 are disposed on the test pads 142 and 242, respectively. This makes it possible to prevent the imaging element 1 from being damaged by the protrusions formed on the surfaces of the test pads 142 and 242.

2. Second Embodiment

In the imaging element 1 according to the above-described first embodiment, the needle 3 of the test probe is brought into contact with the front surface of the test pad 142. In contrast, an imaging element 1 according to a second embodiment of the present disclosure differs from the above-described first embodiment in that a protective metal film is disposed on the front surface of the test pad 142, and the needle 3 of the test probe is brought into contact with the protective metal film.

[Configuration of Pad]

Figure 17:
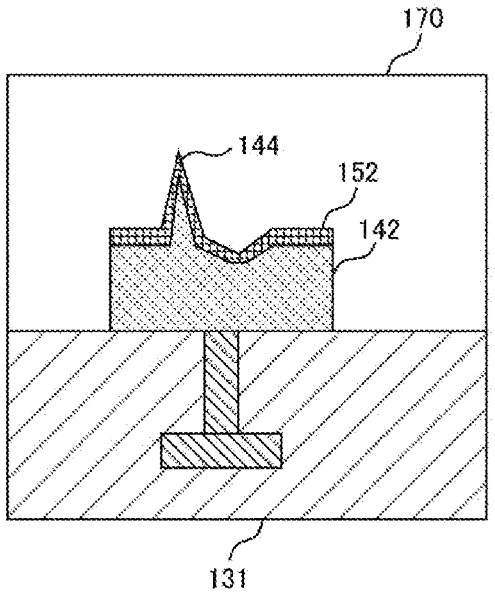
FIG. 17 is a diagram illustrating a configuration example of a test pad according to a second embodiment of the present disclosure.

FIG. 17 is a diagram illustrating a configuration example of a test pad according to the second embodiment of the present disclosure. That figure is a schematic cross-sectional view illustrating a configuration example of the test pad 142, similarly to FIG. 4. This differs from the test pad 142 described with reference to FIG. 4 in that the protective metal film 152 is disposed also on the surface of the recess 143.

Figure 9:
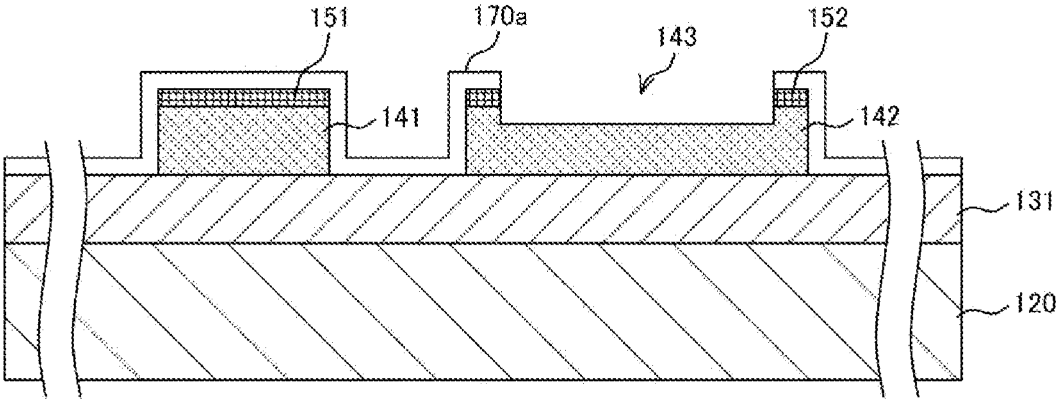
FIG. 9 is a diagram illustrating the example of the method for manufacturing the imaging chip according to the first embodiment of the present disclosure.
Figure 9:
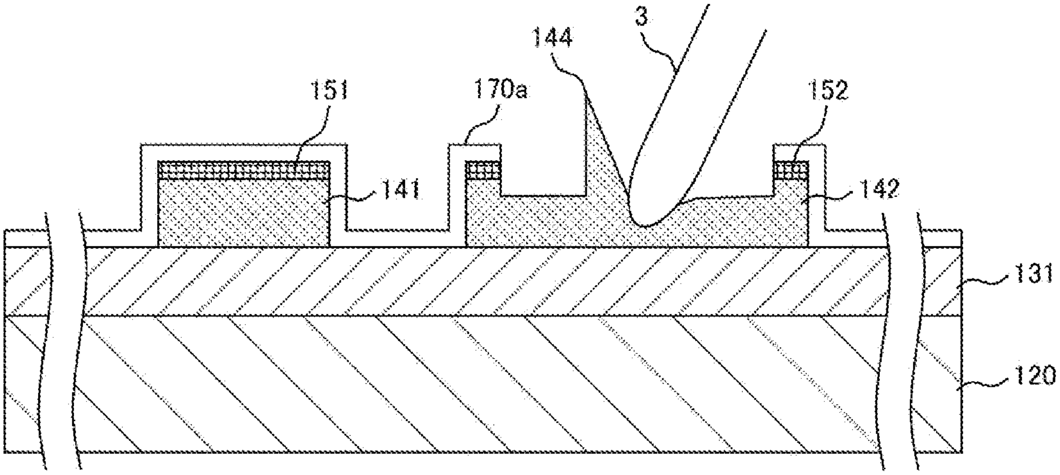
Figure 9:
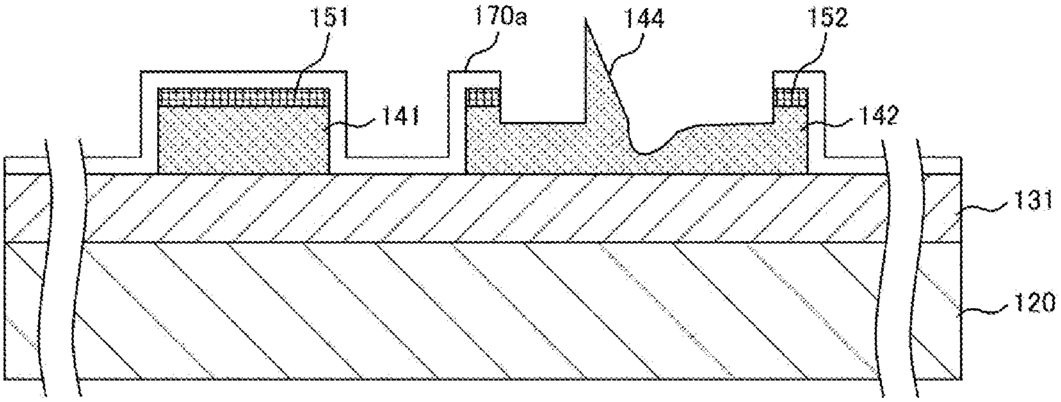
Figure 10:
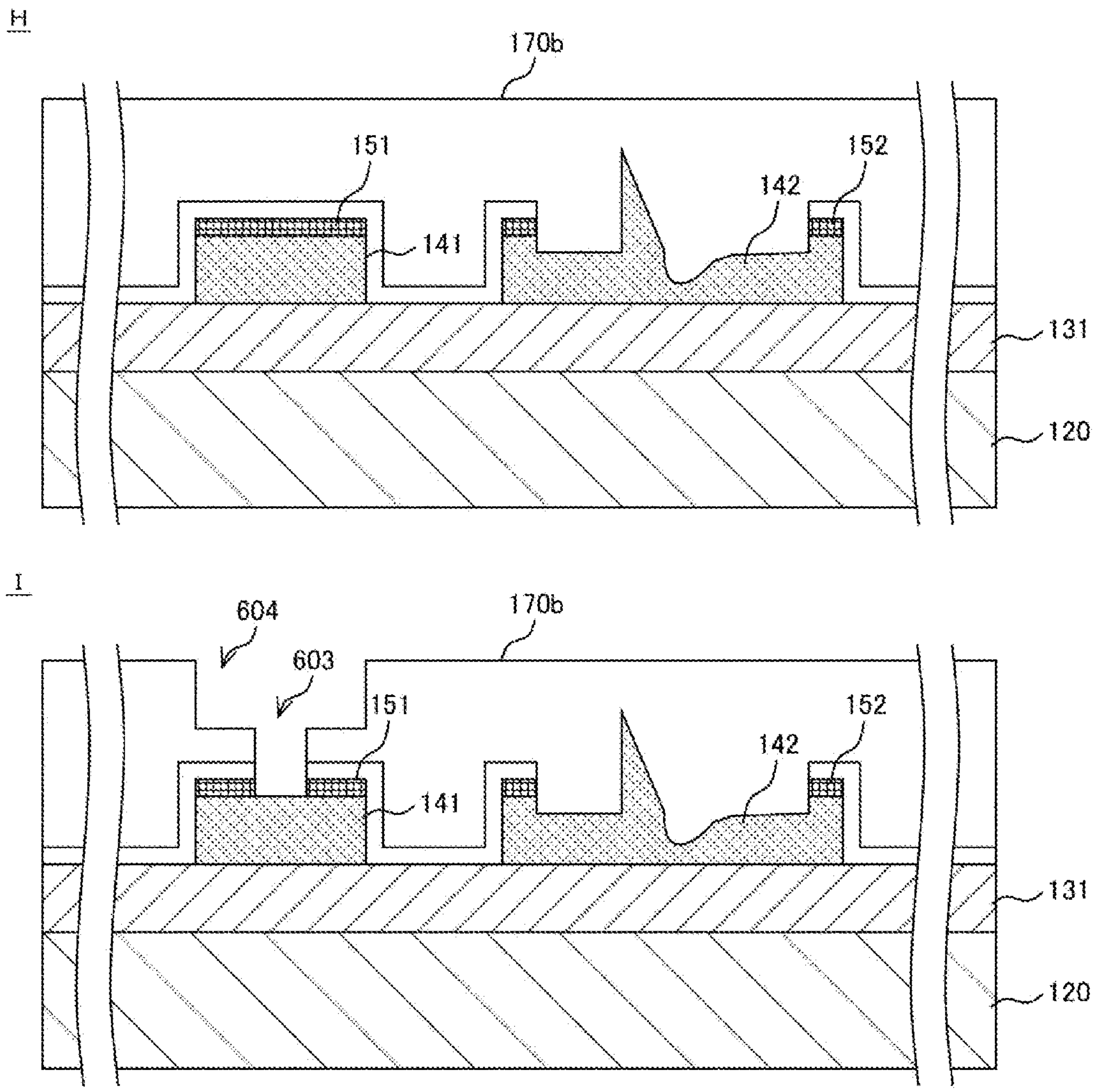
FIG. 10 is a diagram illustrating the example of the method for manufacturing the imaging chip according to the first embodiment of the present disclosure.
Figure 11:
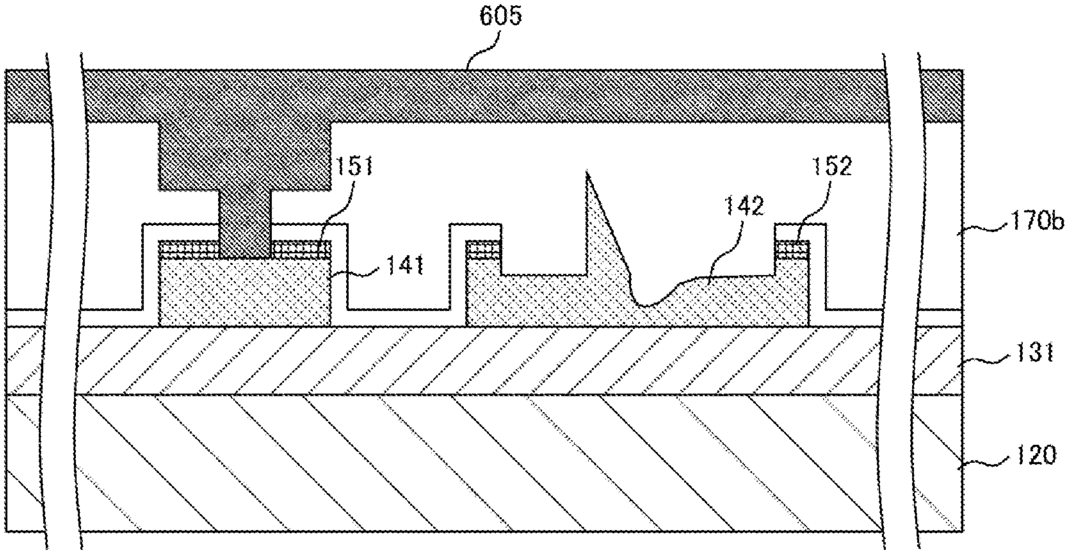
FIG. 11 is a diagram illustrating the example of the method for manufacturing the imaging chip according to the first embodiment of the present disclosure.
Figure 11:
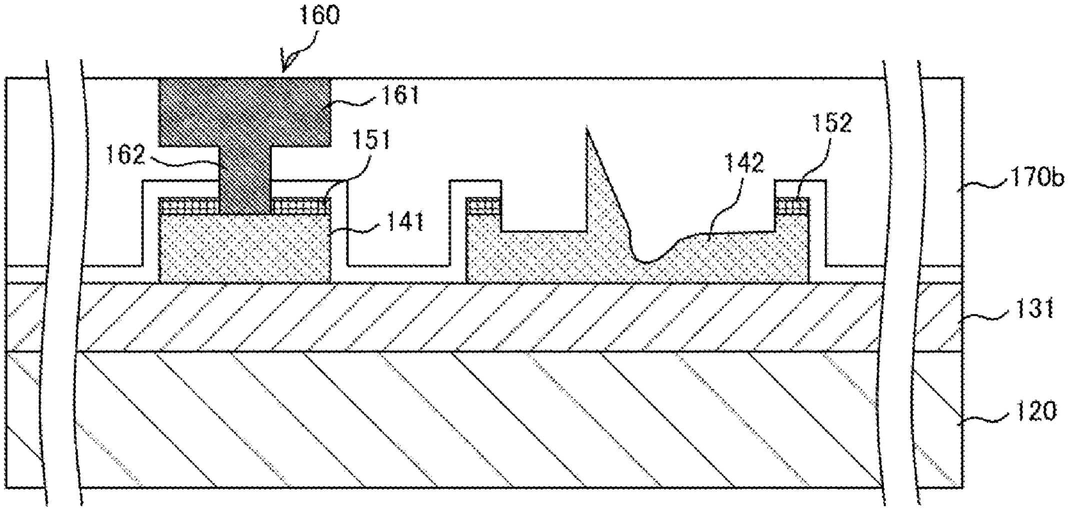

The protective metal film 152 illustrated in the figure can be formed by leaving the protective metal film 152 in the step of etching described with reference to E of FIG. 9. Thus, the protective metal film 152 is disposed on the surface of the test pad 142, so that the needle 3 of the test probe is allowed to come into contact with the surface of the protective metal film 152. Since the protective metal film 152 has a hardness higher than Al, which is a material of the test pad 142, the height of the protrusion 144 may be reduced. This makes it possible to separate the tip of the protrusion 144 from the front surface of the imaging chip 100. It is possible to improve the margin of the distance between the tip of the protrusion 144 and the front surface of the imaging chip 100. Further, the thickness of the insulating film 170 can be reduced, and the imaging element 1 can be made thinner accordingly. In that figure, the thickness of the insulating film 170 can be set to the thickness (T2 illustrated in the figure) from the surface of the protective metal film 152 to the surface of the wiring region 130.

A configuration of the imaging element 1 other than the above-described configuration is the same as the configuration of the imaging element 1 described in the first embodiment of the present disclosure and thus description thereof will be omitted.

As described above, in the imaging element 1 according to the second embodiment of the present disclosure, the protective metal film 152 is disposed on a region of the surface of the test pad 142 with which the needle 3 of the test probe is brought into contact. This makes it possible to design the height of the protrusion 144 of the test pad 142 to be small, thus improving the yield in manufacturing the imaging element 1.

3. Third Embodiment

The imaging element 1 according to the above-described first embodiment is composed of two semiconductor chips, the imaging chip 100 and the logic chip 200, which are bonded together. In contrast, an imaging element 1 according to a third embodiment of the present disclosure differs from the above-described first embodiment in that three or more semiconductor chips are bonded together.

[Configuration of Imaging Element]

Figure 18:
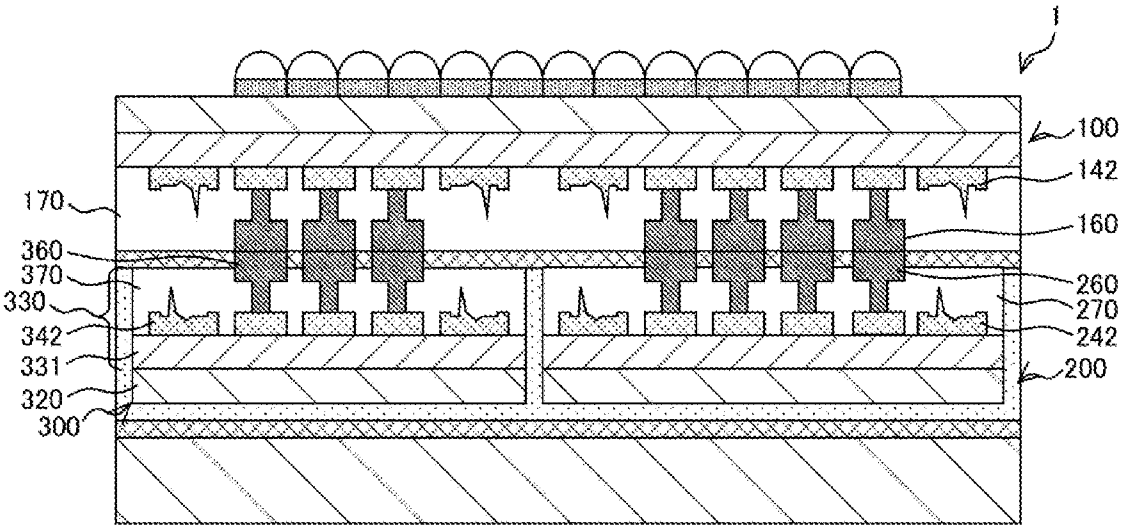
FIG. 18 is a diagram illustrating a configuration example of an imaging element according to a third embodiment of the present disclosure.

FIG. 18 is a diagram illustrating a configuration example of an imaging element according to the third embodiment of the present disclosure. That figure is a schematic cross-sectional view illustrating a configuration example of the imaging element 1, similar to FIG. 3. It differs from the imaging element 1 illustrated in FIG. 3 in that a semiconductor chip 300 is disposed in addition to the imaging chip 100 and the logic chip 200.

The semiconductor chip 300 is a semiconductor chip bonded to the imaging chip 100. This semiconductor chip 300 includes a semiconductor substrate 320 and a wiring region 330. A test pad 342, a surface pad 360, and an insulating film 370 are disposed in the wiring region 330. A test is performed using the test pad 342, and the surface pad 360 is joined to the surface pad 160 of the imaging chip 100 at the time of bonding. In the semiconductor chip 300, for example, the vertical driving unit 60 described with reference to FIG. 2 can be disposed. In this case, the column signal processing unit 70 and the control unit 80 can be disposed in the logic chip 200. Further, other processing circuits and the like can be disposed in the semiconductor chip 300. For example, a memory circuit for performing processing of storing an image signal or a circuit for performing AI (Artificial Intelligent) processing can be disposed.

Note that the surface pad 360 is an example of the first pad recited in the claims The test pad 342 is an example of the second pad recited in the claims.

A configuration of the imaging element 1 other than the above-described configuration is the same as the configuration of the imaging element 1 described in the first embodiment of the present disclosure and thus description thereof will be omitted.

As described above, the imaging element 1 according to the third embodiment of the present disclosure is composed of the three or more semiconductor chips which are bonded together. Accordingly, it is possible to simplify the imaging element 1.

4. Fourth Embodiment

In the imaging element 1 according to the above-described third embodiment, the logic chip 200 and the semiconductor chip 300 are bonded to the imaging chip 100. In contrast, an imaging element 1 according to a fourth embodiment of the present disclosure differs from the above-described third embodiment in that the imaging chip 100, the logic chip 200, and the semiconductor chip 300 are laminated one on another.

[Configuration of Imaging Element]

Figure 19:
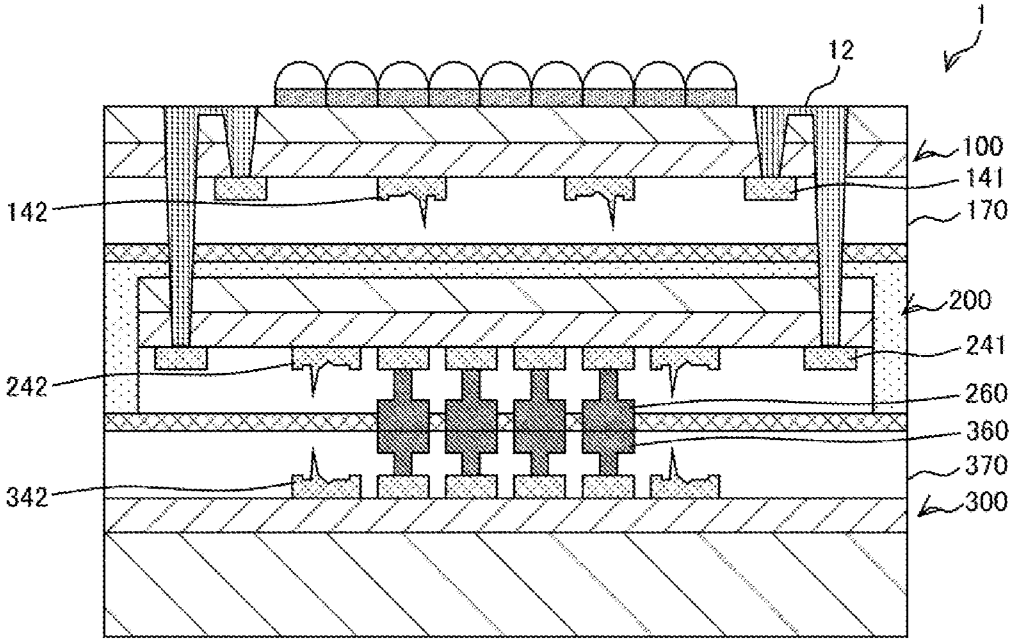
FIG. 19 is a diagram illustrating a configuration example of an imaging element according to a fourth embodiment of the present disclosure.

FIG. 19 is a diagram illustrating a configuration example of the imaging element according to the fourth embodiment of the present disclosure. That figure is a schematic cross-sectional view illustrating a configuration example of the imaging element 1, similar to FIG. 18. It differs from the imaging element 1 illustrated in FIG. 18 in that the imaging chip 100, the logic chip 200, and the semiconductor chip 300 are laminated one on another.

In the imaging element 1 illustrated in that figure, the surface pad 260 of the logic chip 200 and the surface pad 360 of the semiconductor chip 300 are joined to each other and bonded together. The imaging chip 100 is bonded to the back side of the logic chip 200. The signal transmission between the imaging chip 100 and the logic chip 200 can be performed by a twin contact 12 in which the two via plugs are connected. One via plug of the twin contact 12 is connected to the pad 141 of the imaging chip 100, and the other via plug is connected to the pad 241 of the logic chip 200. Further, the two via plugs are connected by a conductor on the back surface of the imaging chip 100. This makes it possible to transmit signals between the pad 141 of the imaging chip 100 and the pad 241 of the logic chip 200.

<Another Configuration of Imaging Element>

Figure 20:
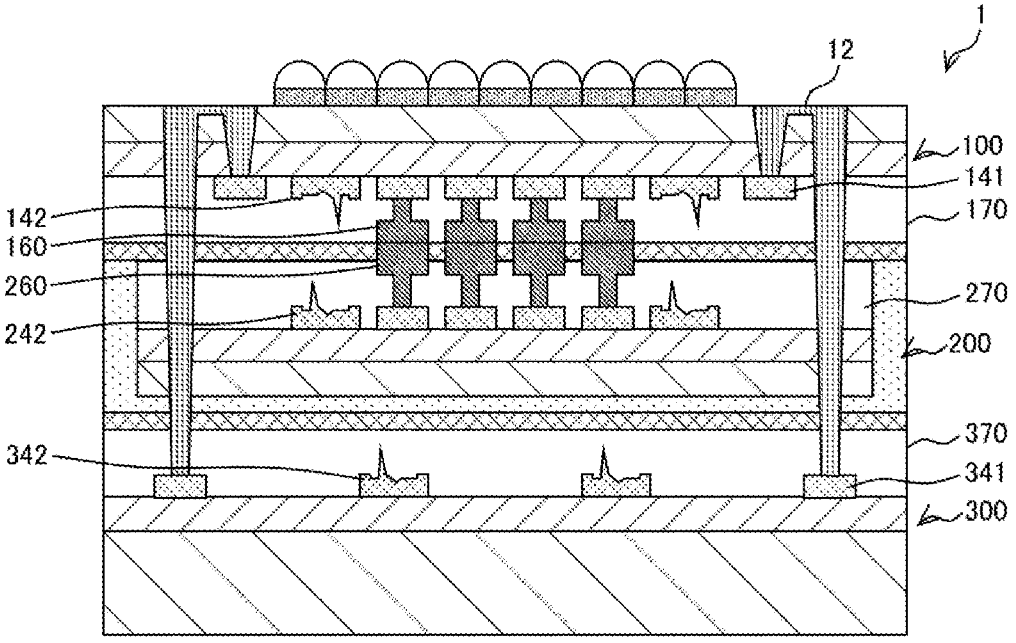
FIG. 20 is a diagram illustrating another configuration example of the imaging element according to the fourth embodiment of the present disclosure.

FIG. 20 is a diagram illustrating another configuration example of the imaging element according to the fourth embodiment of the present disclosure. That figure is a schematic cross-sectional view illustrating a configuration example of the imaging element 1, similar to FIG. 19. It differs from the imaging element 1 illustrated in FIG. 19 in that the surface pads of the imaging chip 100 and the logic chip 200 are bonded together and the semiconductor chip 300 is bonded to the back side of the logic chip 200. In the imaging element 1 illustrated in the figure, the semiconductor chip 300 is disposed in place of the support substrate 400 of the imaging element 1 described with reference to FIG. 3. The pad 141 of the imaging chip and a pad 341 of the semiconductor chip 300 are connected to each other by the twin contact 12.

A configuration of the imaging element 1 other than the aforementioned configuration is the same as the configuration of the imaging element 1 described in the third embodiment of the present disclosure and thus description thereof will be omitted.

As described above, the imaging element 1 according to the fourth embodiment of the present disclosure is composed of the three or more semiconductor chips which are laminated one on another. Even when semiconductor chips having substantially the same size are disposed in the imaging element 1, they can be bonded together.

<5. Example of Application to Camera>

The technology according to the present disclosure (the present technology) can be applied to various products. For example, the present technology may be realized as an imaging element mounted on an imaging device such as a camera.

Figure 21:
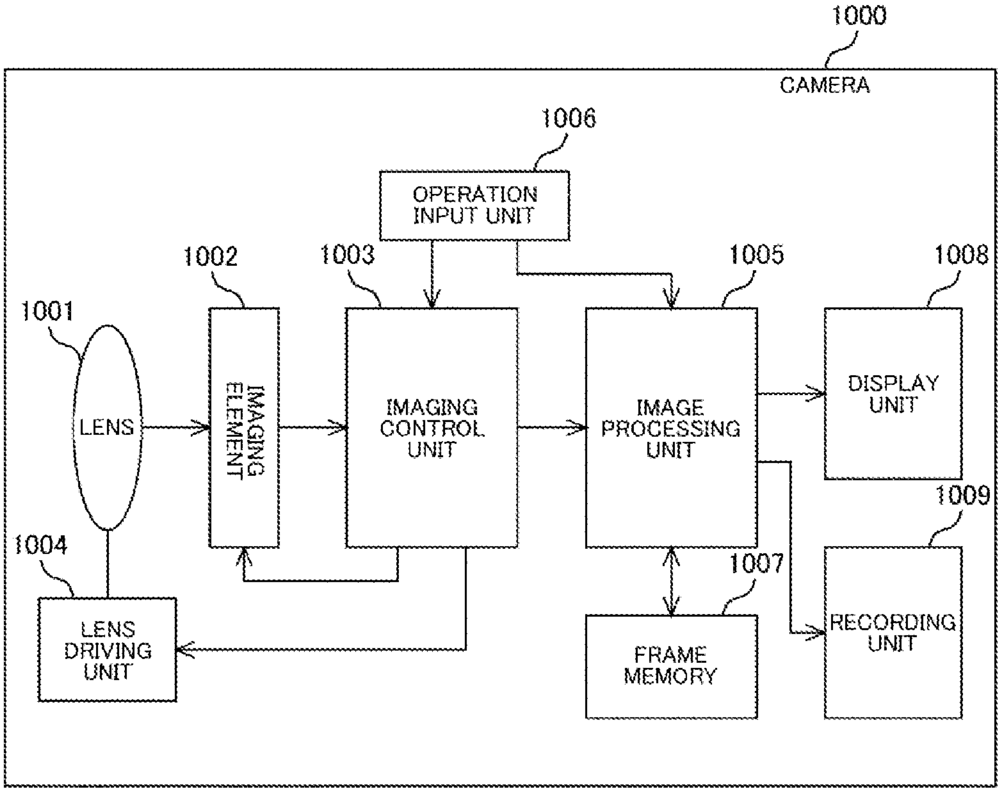
FIG. 21 is a block diagram illustrating a schematic configuration example of a camera which is an example of an imaging device to which the present technology can be applied.

FIG. 21 is a block diagram illustrating a schematic configuration example of a camera which is an example of an imaging device to which the present technology is applicable. A camera 1000 in the drawing includes a lens 1001, an imaging element 1002, an imaging control unit 1003, a lens driving unit 1004, an image processing unit 1005, an operation input unit 1006, a frame memory 1007, a display unit 1008, and a recording unit 1009.

The lens 1001 is an imaging lens of the camera 1000. The lens 1001 focuses light from a subject, causing the light to be incident on the imaging element 1002, which will be described later, and forms an image of the subject.

The imaging element 1002 is a semiconductor element that images the light from the subject focused by the lens 1001. The imaging element 1002 generates an analog image signal corresponding to emitted light, converts the analog image signal into a digital image signal, and outputs the digital image signal.

The imaging control unit 1003 controls imaging in the imaging element 1002. The imaging control unit 1003 controls the imaging element 1002 by generating a control signal and outputting the control signal to the imaging element 1002. In addition, the imaging control unit 1003 can perform auto-focus in the camera 1000 on the basis of an image signal output from the imaging element 1002. Here, the auto-focus is a system that detects a focal position of the lens 1001 and automatically adjusts the focal position. As the auto-focus, a method of detecting an image surface phase difference according to phase difference pixels disposed in the imaging element 1002 to detect a focal position (image surface phase difference auto-focus) can be used. In addition, a method of detecting a position at which the contrast of an image is maximized as a focal position (contrast auto-focus) can also be applied. The imaging control unit 1003 adjusts the position of the lens 1001 through the lens driving unit 1004 on the basis of the detected focal position and performs auto-focus. Meanwhile, the imaging control unit 1003 can be configured as, for example, a digital signal processor (DSP) provided with firmware.

The lens driving unit 1004 drives the lens 1001 on the basis of control by the imaging control unit 1003. The lens driving unit 1004 can drive the lens 1001 by changing the position of the lens 1001 using a built-in motor.

The image processing unit 1005 processes an image signal generated by the imaging element 1002. This processing corresponds to, for example, demosaicing for generating an image signal of an insufficient color among image signals corresponding to red, green, and blue for each pixel, noise reduction for removing noise in an image signal, image signal encoding, and the like. The image processing unit 1005 can be configured of, for example, a microcomputer provided with firmware.

The operation input unit 1006 receives an operation input from a user of the camera 1000. For example, a pushbutton or a touch panel can be used as the operation input unit 1006. An operation input received by the operation input unit 1006 is transmitted to the imaging control unit 1003 and the image processing unit 1005. Thereafter, processing corresponding to the operation input, for example, processing such as imaging of a subject is started.

The frame memory 1007 is memory that stores a frame which is an image signal corresponding to one screen. The frame memory 1007 is controlled by the image processing unit 1005 and holds frames during image processing.

The display unit 1008 displays an image processed by the image processing unit 1005. For example, a liquid crystal panel can be used as the display unit 1008.

The recording unit 1009 records an image processed by the image processing unit 1005. For example, a memory card or a hard disk can be used as the recording unit 1009.

A camera to which the present disclosure can be applied has been described above. The present technique can be applied to the imaging element 1002 among the components described above. Specifically, the imaging element 1 illustrated in FIG. 1 can be applied to the imaging element 1002.

The configuration of the test pad 142 of the second embodiment can be combined with other configurations. Specifically, the protective metal film 152 illustrated in FIG. 17 can be applied to the test pad 142 and others of FIGS. 18 to 18.

Finally, the descriptions of the above-described embodiments are merely examples of the present disclosure, and the present disclosure is not limited to the above-described embodiments. Therefore, it goes without saying that various changes aside from the above-described embodiments can be made according to the design and the like within a scope that does not depart from the technical spirit of the present disclosure.

Additionally, the effects described in the present specification are merely examples and not limited. Other effects may be obtained as well.

In addition, the drawings in the above-described embodiments are schematic, and dimensional ratios and the like of respective parts are not necessarily consistent with actual ones. In addition, the drawings of course include parts where dimensional relationships and ratios differ from drawing to drawing.

The present technology can also be configured as follows.

(1) An imaging element including:

a plurality of semiconductor chips each including a semiconductor substrate and a wiring region, the semiconductor chips being bonded together, one of the plurality of semiconductor chips being disposed with a photoelectric conversion unit that performs photoelectric conversion of incident light, two of the plurality of semiconductor chips each including a first pad, surfaces of the wiring regions of the two semiconductor chips being bonded together, the first pads being disposed on the respective surfaces of the wiring regions and being joined to each other when the surfaces are bonded, at least one of the two semiconductor chips further including a second pad disposed in the wiring region and an insulating film disposed between the second pad and the surface for bonding, the second pad being formed with a protrusion toward the surface for bonding.

(2) The imaging element according to (1), wherein the insulating film is formed to have a thickness to cover the second pad.

(3) The imaging element according to (2), wherein the insulating film is formed to have a thickness of 650 nm or more.

(4) The imaging element according to any one of (1) to (3), wherein the insulating film is formed of an insulating material.

(5) The imaging element according to (4), wherein the insulating film contains the insulating material made of a silicon compound.

(6) The imaging element according to any one of (1) to (5), further including a protective metal film disposed on a surface of the second pad.

(7) The imaging element according to any one of (1) to (6), wherein at least one of the plurality of semiconductor chips further includes a third pad for connecting to an external circuit.

(8) The imaging element according to (7), wherein the third pad is disposed in a same layer as the second pad.

(9) The imaging element according to any one of (1) to (8), wherein the second pad is formed to have a different size from the first pad.

(10) The imaging element according to (9), wherein the second pad is formed to have a size larger than the first pad.

(11) The imaging element according to any one of (1) to (10), wherein the second pad is made of aluminum.

(12) The imaging element according to any one of (1) to (11), wherein the second pad has the protrusion formed by a needle contact test.

(13) The imaging element according to any one of (1) to (12), wherein the second pad has the protrusion formed in a recess disposed on a side of the surface for bonding.

(14) The imaging element according to any one of (1) to (13), wherein two of the plurality of semiconductor chips each includes the second pad disposed so as to face the other second pad.

(15) The imaging element according to any one of (1) to (14), wherein the first pad is made of copper.

(16) The imaging element according to any one of (1) to (15), wherein at least one of the plurality of semiconductor chips is disposed with a processing circuit for processing an image signal generated based on the photoelectric conversion.

(17) The imaging element according to (16), wherein two of the plurality of semiconductor chips are each disposed with the processing circuit and are bonded together.

(18) The imaging element according to (1), wherein the photoelectric conversion unit performs photoelectric conversion of the incident light with which a different surface from the surface on which the wiring region of the semiconductor chip is disposed is irradiated.

(19) A method for manufacturing an imaging element, the method including:

a step of disposing a photoelectric conversion unit, in which the photoelectric conversion unit that performs photoelectric conversion of incident light is disposed on a semiconductor substrate;

a step of disposing a second pad, in which the second pad is disposed in a wiring region, the second pad being formed with a protrusion toward a surface for bonding when wiring regions respectively disposed on two semiconductor substrates are bonded together;

a step of forming an insulating film, in which the insulating film is formed on a surface of the second pad;

a step of disposing a first pad, in which the first pad is disposed on a surface of the writing region in which the second pad is disposed, the first pad being joined to another first pad when the wiring regions are bonded together; and a step of bonding, in which the wiring regions of two semiconductor chips in which the first pads are disposed are bonded together and the respective first pads are joined to each other.

(20) The method for manufacturing an imaging element according to (19), further including a step of testing, in which a test is performed with the second pad disposed, wherein the step of forming an insulating film includes forming the insulating film in the wiring region in which the second pad with which the test has been performed is disposed.

REFERENCE SIGNS LIST

1, 1002 Imaging element
15, 16 Oxide film bonding layer
19 Oxide film

50 Pixel array unit
60 Vertical driving unit
70 Column signal processing unit
80 Control unit
100 Imaging chip
110 Pixel
120, 220, 320 Semiconductor substrate
130, 230, 330 Wiring region
141, 161, 241, 341 Pad
142, 242, 342 Test pad
143 Recess
148, 248 Bonding pad
149 Imitation pad
151, 152, 158, 159 Protective metal film
160, 260, 360 Surface pad
162 Via plug
170, 170*a*, 170*b*, 270 Insulating film
171 to 173 Insulating material film
200 Logic chip
300 Semiconductor chip

What is claimed is:

1. An imaging element, comprising:

a plurality of semiconductor chips each including a semiconductor substrate and a wiring region, the semiconductor chips being bonded together;

one of the plurality of semiconductor chips includes a photoelectric conversion unit that performs photoelectric conversion of incident light; and two semiconductor chips of the plurality of semiconductor chips each including a first pad, wherein surfaces of the wiring regions of the two semiconductor chips are bonded together, and the first pads are disposed on the respective surfaces of the wiring regions and joined to each other, wherein at least one of the two semiconductor chips further includes a second pad disposed in the wiring region and an insulating film disposed between the second pad and a corresponding one of the surfaces of the wiring regions, the second pad of each of the at least one of the two semiconductor chips includes a protrusion toward the corresponding surface, and wherein the insulating film is formed to have a thickness of 650 nm or more.

2. The imaging element according to claim 1, wherein the insulating film is formed to have a thickness to cover the second pad of each of the at least one of the two semiconductor chips.

3. The imaging element according to claim 1, wherein the insulating film is formed of an insulating material.

4. The imaging element according to claim 3, wherein the insulating film contains the insulating material made of a silicon compound.

5. The imaging element according to claim 1, further comprising a protective metal film disposed on a surface of the second pad of each of the at least one of the two semiconductor chips.

6. The imaging element according to claim 1, wherein at least one of the plurality of semiconductor chips further includes a third pad for connecting to an external circuit.

7. The imaging element according to claim 6, wherein the third pad of each of the at least one of the plurality of semiconductor chips is disposed in a same layer as the second pad of each of the at least one of the two semiconductor chips.

8. The imaging element according to claim 1, wherein the second pad of each of the at least one of the two semiconductor chips is formed to have a different size from the first pads.

9. The imaging element according to claim 8, wherein the second pad of each of the at least one of the two semiconductor chips is formed to have a size larger than the first pads.

10. The imaging element according to claim 1, wherein the second pad of each of the at least one of the two semiconductor chips is made of aluminum.

11. The imaging element according to claim 1, wherein the second pad of each of the at least one of the two semiconductor chips has the protrusion formed by a needle contact test.

12. The imaging element according to claim 1, wherein the second pad of each of the at least one of the two semiconductor chips has the protrusion formed in a recess disposed on a side of the surface for bonding.

13. The imaging element according to claim 1, wherein two of the plurality of semiconductor chips each includes the second pad disposed so as to face each other the other second pad.

14. The imaging element according to claim 1, wherein the first pads are made of copper.

15. The imaging element according to claim 1, wherein at least one of the plurality of semiconductor chips is disposed with a processing circuit for processing an image signal generated based on the photoelectric conversion.

16. The imaging element according to claim 15, wherein two of the plurality of semiconductor chips are each disposed with the processing circuit and are bonded together.

17. The imaging element according to claim 1, wherein the photoelectric conversion unit performs photoelectric conversion of the incident light with which a different surface from the surface on which the wiring region of the semiconductor chip is disposed is irradiated.

18. A method for manufacturing an imaging element, the method comprising:

a step of disposing a photoelectric conversion unit, in which the photoelectric conversion unit that performs photoelectric conversion of incident light is disposed on a semiconductor substrate;

a step of disposing a second pad, in which the second pad is disposed in a wiring region, the second pad being formed with a protrusion toward a surface for bonding when wiring regions respectively disposed on two semiconductor substrates are bonded together;

a step of forming an insulating film, in which the insulating film is formed on a surface of the second pad;

a step of disposing a first pad, in which the first pad is disposed on a surface of the wiring region in which the second pad is disposed, the first pad being joined to another first pad when the wiring regions are bonded together; and a step of bonding, in which the wiring regions of two semiconductor chips in which the first pads are disposed are bonded together and the respective first pads are joined to each other, wherein the insulating film is formed to have a thickness of 650 nm or more.

19. The method for manufacturing an imaging element according to claim 18, further comprising a step of testing, in which a test is performed with the second pad disposed, wherein the step of forming an insulating film includes forming the insulating film in the wiring region in which the second pad with which the test has been performed is disposed.

20. The imaging element according to claim 1, wherein the second pad of each of the at least one of the two semiconductor chips further includes a plurality of recesses.

* * * * *